United States Patent
Hashimoto et al.

(10) Patent No.: US 6,376,388 B1
(45) Date of Patent: *Apr. 23, 2002

(54) DRY ETCHING WITH REDUCED DAMAGE TO MOS DEVICE

(75) Inventors: Koichi Hashimoto; Daisuke Matsunaga, both of Kawasaki; Masaaki Aoyama, Kasugai, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/787,451

(22) Filed: Jan. 22, 1997

Related U.S. Application Data

(63) Continuation of application No. 08/275,426, filed on Jul. 15, 1994, now abandoned.

(30) Foreign Application Priority Data

Jul. 16, 1993 (JP) .............................. 5-176956

(51) Int. Cl.[7] ...................... H01L 21/302; H01L 21/461
(52) U.S. Cl. ...................... 438/728; 438/732; 216/70; 216/71
(58) Field of Search ................................ 438/728, 732; 216/70, 71

(56) References Cited

U.S. PATENT DOCUMENTS

| | | | |
|---|---|---|---|
| 4,298,419 A | * 11/1981 | Suzuki et al. .................. | 216/70 |
| 4,563,367 A | * 1/1986 | Sherman ...................... | 156/643 |
| 4,564,997 A | * 1/1986 | Matsuo et al. ............... | 156/647 |
| 4,960,073 A | * 10/1990 | Suzuki et al. ............... | 156/345 |

(List continued on next page.)

FOREIGN PATENT DOCUMENTS

| | | | |
|---|---|---|---|
| JP | 60-117723 | 6/1985 | |
| JP | 63-43324 | * 2/1988 | .................. 156/345 |

(List continued on next page.)

OTHER PUBLICATIONS

N. Jiwari et al., Jpn.J.Appl.Phys. 32(6b)(1993)3019 "Al etching ... helicon wave plasma", Jun. 1993.*
Y. Ra et al., J.Vac.Sci. Technol. 11(6)(1993)2911 "Direct current bias ... transformer coupled plasma etcher", Nov. 1993.*
M. W. Horn et al., Optical Eng. 32(10)(1993)2388 "Comparison of etching tools ... ", Oct. 1993.*
Translation of JP 4–354124.*
S. Samukawa Et Al, J. Vac. Sci. Technol., B9, 3(1991) 1471 "400 kHz RF Biased ECR Plasma Etching for Al–Si–CU ... ".*

(List continued on next page.)

*Primary Examiner*—Long Pham
*Assistant Examiner*—S. A Brairton
(74) *Attorney, Agent, or Firm*—Arent Fox Kintner Plotkin & Kahn, PLLC

(57) ABSTRACT

A method of manufacturing a semiconductor device having an insulated gate type field effect transistor. A gate insulating film, a gate electrode layer having a predetermined area and facing the semiconductor substrate with the gate insulating film being interposed therebetween, an interlayer insulating film, and a wiring layer connected to the gate electrode layer, are formed on a semiconductor substrate in the order recited. A conductive material layer and a resist layer are formed on the wiring layer. The resist layer is patterned to form a resist mask forming a wiring pattern having an antenna ratio of about ten times or more of the predetermined area of the gate electrode layer. At least the conductive material layer is plasma-etched by using the resist mask as an etching mask, and thereafter, the resist mask is removed and the wiring layer is plasma-etched.

41 Claims, 15 Drawing Sheets

U.S. PATENT DOCUMENTS

| | | | | | |
|---|---|---|---|---|---|
| 4,971,651 | A | * | 11/1990 | Watanabe et al. | 216/70 |
| 5,016,564 | A | * | 5/1991 | Nakamura et al. | 156/345 |
| 5,022,977 | A | * | 6/1991 | Matsuola et al. | |
| 5,156,703 | A | * | 10/1992 | Oechsnes | 156/643 |
| 5,183,777 | A | * | 2/1993 | Dori et al. | 437/225 |
| 5,259,922 | A | * | 11/1993 | Yamanot et al. | 156/643 |
| 5,290,382 | A | * | 3/1994 | Zarowin et al. | 204/298.33 |
| 5,344,536 | A | * | 9/1994 | Obuchi et al. | 156/643 |
| 5,350,710 | A | * | 9/1994 | Hong et al. | 156/643.1 |
| 5,368,685 | A | * | 11/1994 | Kumihashi et al. | 216/70 |
| 5,378,311 | A | * | 1/1995 | Najayama et al. | 156/643.1 |
| 5,444,207 | A | * | 8/1995 | Sekine et al. | 204/298.37 |

FOREIGN PATENT DOCUMENTS

| | | | | | |
|---|---|---|---|---|---|
| JP | | 1-14920 | * | 1/1989 | 156/345 |
| JP | | 1-32631 | * | 2/1989 | 156/345 |
| JP | | 2-94628 | * | 4/1990 | 156/345 |
| JP | | 4-340717 | | 11/1992 | |
| JP | | 04-354124 | * | 12/1992 | |
| JP | | 5-90224 | | 4/1993 | |
| JP | | 5-234955 | * | 9/1993 | 216/70 |

OTHER PUBLICATIONS

S. Samukawa, Jpn. J. Appl. Phys., 30, 1 B, (1991) 3154 "400 kHz RF Biased ECR Resonance Position Etching".*

S. Wolf "Silicon Processing for the VLSI Era" vol. I, 1986, p. 581.*

S. Wolf "Silicon Processing for the VLSI Era" vol. II, 1992, p. 53, 237–8.*

H. Nihei et al, Rev. Sci. Instrum., 63 (3) Mar. 1992 p. 1932 ". . . Plasma Source Using an Axial Mirror and Multipole Fields".*

M. Shimada Et Al., J. Vac. Sci. Technol. A 11(4), Jul./Aug. 1993, p. 1313 "Compact ECR Ion Source Wieu a Permanent Magnet".*

K. Junck Et Al., J. Vac. Sci. Technol., Al2(3), May/Jun. 1994, p. 760 ". . . ECR Plasmas in 3 Magnetic Field Configurations".*

K. Hashimoto, Jpn. J. Appl. Phys., 32 (1993) 6109 "Charge Damage in Plasma Etching . . . Through Antenna".*

"Charging Damage to Gate Oxides in an $O_2$ Magnetron Plasma", Fang et al, J. Appl. Phys., vol. 72, No. 10, Nov. 15, 1992, pp. 4865–4872.

* cited by examiner

DRY ETCHING WITH REDUCED DAMAGE TO MOS DEVICE

This application is a continuation of application Ser. No. 08/275,426, filed Jul. 15, 1994, now abandoned.

BACKGROUND OF THE INVENTION a) Field of the Invention

The present invention relates to a semiconductor device and its manufacturing method, and more particularly to a semiconductor device having insulated gate type field effect transistors (IGFET) fabricated at a high integration.

b) Description of the Related Art

As patterns of large scale integration (LSI) circuits are becoming finer, it is desired to improve a pattern transfer precision. Anisotropic dry etching such as reactive ion etching (RIE) and electron cyclotron resonance (ECR) plasma etching is widely used so as to reliably transfer a mask pattern on a layer such as a wiring layer to be processed. Such anisotropic dry etching uses plasma or ions.

A plasma process is likely to produce an electrical stress such as a damage caused by non-uniformity of plasma (refer to J. Appl. Phys. 72 (1992) pp. 4865–4872). As patterns are becoming finer, the gate insulating film of an insulated gate type field effect transistor (IGFET) is becoming thinner. There are many gate insulating films which have a thickness of 10 nm or less and are susceptible to influences and damages by an electrical stress. For example, if a Fowler-Nordheim (FN) tunnel current flows through a gate insulating film, defects corresponding in amount to an integrated current flow are formed so that the threshold voltage changes. If a dielectric breakdown occurs, the gate electrode and semiconductor substrate are short-circuited.

A gate oxide film having a thickness of 10 nm is full of danger of breakdown when a voltage of 10 to 15 V or higher is applied. In a plasma atmosphere, a potential Vdc at the surface of a layer to be processed reaches 100 to 1000 V. It is not easy to set a uniformity of potential distribution 5% or less.

Therefore, there is a high danger of breaking a gate insulating film during a plasma process. This danger is present not only when patterning a wiring layer, but also when opening a contact hole or when cleaning a contact hole by plasma sputtering.

Conventionally, such a damage phenomenon has been considered to be resulted from non-uniformity of the electric or magnetic property of plasma. Therefore, as a means of eliminating damages, it has been endeavored to generate and use uniform plasma.

More specifically, it has been proposed to uniformize a bias voltage by providing a uniform plasma potential and a position independence of an electron mobility. For example, in a configuration that magnetic fluxes traverse over the surface of a layer to be processed, it has been proposed not to change the vertical components of a magnetic field between the surfaces of a central area and a peripheral area of a layer to be processed.

The present inventors have found that damages may be generated depending upon a type of patterns to be processed, even if the non-uniformity of plasma is improved.

SUMMARY OF THE INVENTION

It is an object of the present invention to provide a semiconductor device and its manufacturing method, capable of eliminating damages even if fine patterns are processed.

According to one aspect of the present invention, there is provided a method of manufacturing a semiconductor device containing insulated gate type field effect transistors, including the steps of: forming a gate insulating film and an electrode layer on a semiconductor substrate; patterning the electrode layer to form a gate electrode layer having a predetermined area and facing the semiconductor substrate with the gate insulating film being interposed therebetween; forming an interlayer insulating film covering the gate electrode layer; forming a wiring layer connected to the gate electrode layer on the interlayer insulating film; forming a conductive material layer on the wiring layer; coating a resist layer on the conductive material layer; patterning the resist layer to form a resist mask forming a wiring pattern having an antenna ratio of about ten times or more relative to the predetermined area of the gate electrode layer facing the semiconductor substrate; first plasma-etching at least the conductive material layer by using the resist mask as an etching mask; removing the resist mask after the first plasma-etching step; and after removing the resist mask, second plasma-etching at least part of the wiring layer connected to the gate electrode layer.

According to another aspect of the present invention, there is provided a method of manufacturing a semiconductor device having a conductive film pattern with a pattern space of 1 μm or less, including the steps of: forming an electrode layer on part of the surface of a semiconductor substrate, with a thin insulating film being interposed therebetween; forming an interlayer insulating film on the electrode layer, the interlayer insulating film being formed with a contact hole; forming a conductive film on the interlayer insulating film; forming an insulating material mask layer on the conductive film; coating a resist layer on the insulating material mask layer; patterning the resist layer; patterning the insulating material mask layer by using the resist layer as an etching mask; removing the resist layer; and plasma-etching and patterning the conductive layer by using the insulating material mask layer as an etching mask, wherein the thickness of the insulating material mask layer is set to a half or less of a minimum pattern space.

According to a further aspect of the present invention, there is provided a method of manufacturing a semiconductor device, wherein in etching a wiring layer connected to an insulated gate of an insulated gate type field effect transistor or an insulating layer on the wiring layer by using plasma having uniform characteristics and exposed on the surface of a material to be processed, an RF bias having a frequency of 1 MHz or lower is applied to the material to be processed so as to make the amounts of ions and electrons incident generally in the vertical direction upon the surface of the wiring layer, generally equal to each other.

According to a still further aspect of the present invention, there is provided a method of manufacturing a semiconductor device for forming a first wiring layer and a second wiring layer at the same time, the first wiring layer being connected to a gate electrode on a gate insulating film formed on a semiconductor region of a first conductivity type, and the second wiring layer being connected to the semiconductor region, wherein in patterning the first and second wiring layers, a third wiring layer electrically separated from and placed between the first and second wiring layers is left unetched.

In etching a conductive pattern connected to a gate electrode on a thin insulating film and having a high antenna ratio relative to an intrinsic gate area, damages are formed in the gate structure even if uniform plasma is used. However, if the mask of plasma etching is made conductive, it is possible to avoid damages in the gate structure. If a mask is not conductive, an imbalance between positive and negative charges incident upon a conductive layer under the mask to be processed, results in a charge-up of the conductive layer to be processed. If a mask is conductive, it is conceivable that it is not necessary to balance positive and negative barges only by the conductive layer under the mask, but positive arid negative charges are balanced by a combination of the mask and the conductive layer to be processed.

If an antenna ratio is 10 or higher and a charge-up occurs once, a current amplified about 10 times or more flow through the region having a low insulating strength. Therefore, the characteristics of a semiconductor device are easily changed. A balanced charge eliminates a tunnel current and allows a semiconductor device having a desired performance to be manufactured.

If the area of side walls of a non-conductive mask is negligibly small, damages can be avoided. The reason for this may be a small absolute value of negative charges incident upon the side walls of a non-conductive mask. Specifically, damages can be effectively avoided if the thickness of a mask is a half or less of a minimum pattern space.

A conventional uniform plasma can be considered as having the same amounts of positive and negative charges incident upon a flat surface. However, if the incident directions are taken into consideration, uniformity cannot be ensured. Accordingly, it is conceivable that there are irregularities if only the charges incident in the vertical direction through an opening in a non-conductive mask are taken into consideration.

If these irregularities are eliminated, positive and negative charges can be balanced and damages can be avoided. In order to control a balance between positive and negative charges incident in the vertical direction from plasma to the surface of a material to be processed, it is effective that the frequency of an RF bias is set to 1 MHz or lower. It is also effective to apply a divergent magnetic field and an auxiliary mirror magnetic field for balancing charges incident in the vertical direction upon the surface of a material to be processed.

It is possible to avoid damages to be caused by plasma while etching a dense wiring pattern, forming a contact hole, or cleaning a contact hole.

DETAILED DESCRIPTION OF THE PREFERRED EMBODIMENTS

It is known that if any non-uniformity of plasma is present at a plasma etching process, a layer to be etched is likely to have damages.

Such plasma irregularity can be verified by measuring a destruction rate of a MOS diode having a so-called antenna structure or by detecting a shift of a flat band voltage.

The antenna structure is a structure that a structure sensitive to a charged state is electrically connected to a conductor having a large area exposed to plasma. In other words, the potential of the structure sensitive to a charged state is changed by electric charges received from plasma by an antenna having a large exposed area.

The flat band voltage means a voltage necessary For flattening a band distorted by electric charges trapped by an insulating layer or the like. During a plasma process, if electric charges of one polarity are injected into and trapped by the structure, its flat, band voltage changes. By detecting a shift of the flat band voltage, it becomes possible to know the amount of electric charges trapped in the gate insulating film from an FN tunnel current flowed through a MOS diode.

For determining process conditions, changes in flat band voltages or destruction rates of a number of MOS diode structures having an antenna structure formed on the surface of a layer to be processed, are measured to detect an imbalance between positive and negative charges incident upon the surface of the layer to be processed.

However, the detected balance between positive and negative charges indicates a balanced state per unit area on a flat surface, and does not contain information of the directions of incident electric charges.

Photoresist is generally an insulating material, and its aspect ratio increases as a pattern to be processed becomes fine. As a result, even if there is an exact balance between positive and negative charges incident upon the surface of a resist layer, if there is a difference between distributions of incident directions, the amount of electric charges incident upon a conductive layer to be processed and disposed under the resist layer, changes.

Figure 2A:
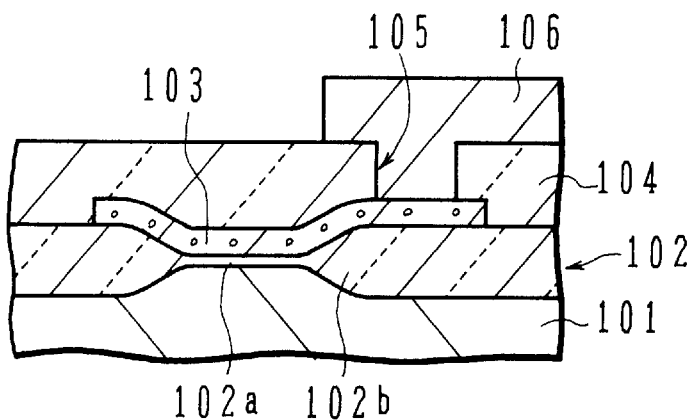
FIGS. 2A to 2D are cross sectional views, a plan view, and a graph, explaining an antenna structure and a tunnel current.
Figure 2B:
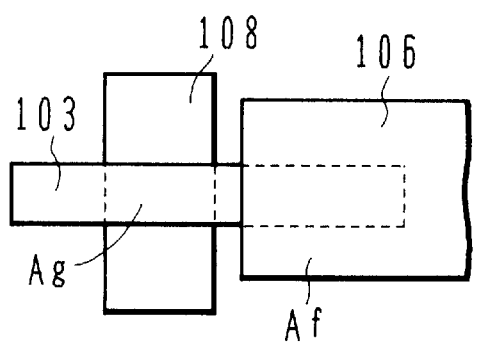

FIGS. 2A and 2B are a cross sectional view and a plan view showing an antenna structure. In FIG. 2A, on the surface of a semiconductor substrate 101 made of, for example, p-type Si, a thick field oxide film 102b is selectively formed. The filed oxide film 102b surrounds an active region 108 shown in FIG. 2B.

A thin gate oxide film 102a is formed on the surface of the active region 108. A gate electrode 103 made of, for example, polycrystalline Si, is formed on the gate oxide film 102a. As shown in FIG. 2B, the gate electrode 103 traverses over the central area of the active region 108 and extends to the field oxide film on the opposite sides of the active region 108.

The gate oxide film on the surface of the active region 108 on the both sides of the gate electrode 103 is removed to form source and drain electrodes.

An interlayer insulating film 104 made of, for example, $SiO_2$, is formed covering the gate electrode 103, and a contact hole 105 is formed in the interlayer insulating film 104, partially exposing the gate electrode 103. A gate wiring layer 106 is formed on the interlayer insulating film 104, connecting the gate electrode 103 via the contact hole 105. The wiring layer 106 has an area Af at least ten times as large as an area Ag of the gate electrode 103 on the active region 108.

The property of the insulating gate structure constituted by the semiconductor substrate 101, gate insulating film 102a, and gate electrode 103 is affected by a Fowler-Nordheim (FN) tunnel current flowing through the gate insulating film 102a.

Figure 2C:
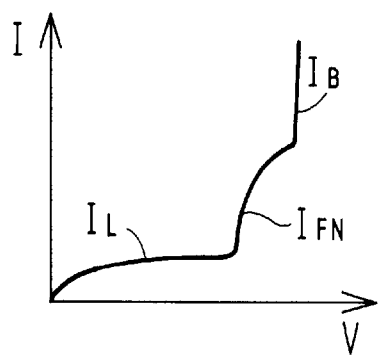

FIG. 2C schematically shows the current-voltage characteristics of a MOS capacitor. The abscissa represents a voltage applied to a MOS capacitor in a linear scale, and the ordinate represents a current flowing through the MOS capacitor in a logarithmic scale. As the applied voltage increases, a leakage current I1, first flows. When the applied voltage is raised to a certain value (when the electric field in the gate insulating film takes a certain intensity), a tunnel current $I_{FN}$ flows through the gate insulating film. As the applied voltage is further raised to a certain voltage, the current abruptly increases to a dielectric breakdown current $I_B$. When the dielectric breakdown current $I_B$ flows, the MOS capacitor is broken. Even if the dielectric breakdown current does riot flow, the characteristics of the MOS capacitor change if the tunnel current $I_{FN}$ flows. The more the tunnel current flows, the more the characteristics of the MOS capacitor are affected.

While the wiring layer 106 having an antenna structure such as shown in FIGS. 2A and 2B is patterned, a charge-up of the layer 106 occurs if positive and negative charges incident upon the layer 106 are unbalanced. The wiring layer 106 to be processed is electrically connected to the gate electrode 103 so that the gate electrode 103 and wiring layer 106 have a different potential from the semiconductor substrate 101 The wiring layer 106 has the thick oxide films 102 and 104 over the semiconductor substrate 101, whereas the gate electrode 103 has only the thin gate insulating film 102a over the semiconductor substrate 101. As a result, as the voltage between the semiconductor substrate 101 and wiring layer 106 rises, a tunnel current flows mainly between the gate electrode 103 and semiconductor substrate 101 via the gate insulating film 102a.

The larger the ratio (antenna ratio) of the area Af of the wiring layer 106 to the area Ag of the intrinsic gate electrode, the more the tunnel current flows via the gate insulating film 102a. Accordingly, if the incident positive and negative charges are unbalanced while a wiring layer having a large antenna ratio is etched, the insulating gate structure facilely changes its characteristics.

Figure 2D:
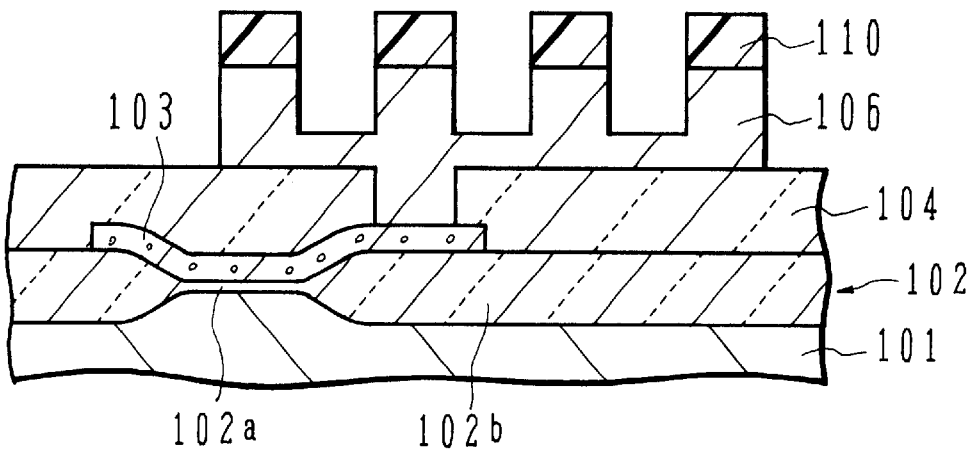

FIG. 2D is a schematic cross sectional view explaining a process of etching a gate wiring layer. In etching a gate wiring layer, in many cases different types of wirings are also etched without etching only the gate wiring. A photoresist pattern 110 is formed on the wiring layer 106 formed over the whole surface of the interlayer insulating film 104. By using the photoresist pattern 110 as an etching mask, the wiring layer 106 is etched.

At the initial stage of the etching process, it is common that some part (e.g., a scribing area) of the wiring layer 106 is in electrical contact with the semiconductor substrate 101. An etching rate lowers at the region having a high pattern density because of the micro loading effect. As a result, even if the etching is completed at the region having a wide pattern pitch, it still continues at the region having a narrow pattern pitch.

Under such conditions, as shown in FIG. 2D, the wiring layer connected to the gate electrode 103 is connected to adjacent wirings and is electrically separated from outer wirings. That is to say, the wiring layer 106 shown in FIG. 2D is electrically separated and connected only to the gate electrode 103. If there is any imbalance between positive and negative charges incident upon the wiring layer 106, a charge-up of the wiring layer 106 occurs easily When the potential of the wiring layer 106 and hence the gate electrode takes a value equal to or larger than a certain value relative to the semiconductor substrate 101, a tunnel current starts flowing via the gate insulating film 102a.

If the amounts of positive and negative charges incident upon the wiring layer 106 having the flat surface such as shown in FIG. 2A are equal, there is no imbalance between charges. However, if the wiring layer is covered with the photoresist pattern as shown in FIG. 2D and there is an imbalance between positive and negative charges incident upon the wiring layer 106 via openings of the photoresist pattern 110, a charge-up occurs.

Even if the amounts of positive and negative charges incident upon the flat surface are equal, if the distributions of angles of incident charges are different, the wiring layer 106 is charged up to the polarity of vertically incident charges having a larger amount, because obliquely incident charges are likely to be trapped by the photoresist pattern 110.

In the case of FIG. 2D, the area Af of the wiring layer which is a reference area of the antenna ratio, is the area exposed by the openings in the photoresist pattern 110. When a wiring layer having a large antenna ratio is etched, an amplified current flows through the gate insulating film 102a so that the characteristics of the insulating gate structure change facilely.

Figure 3A:
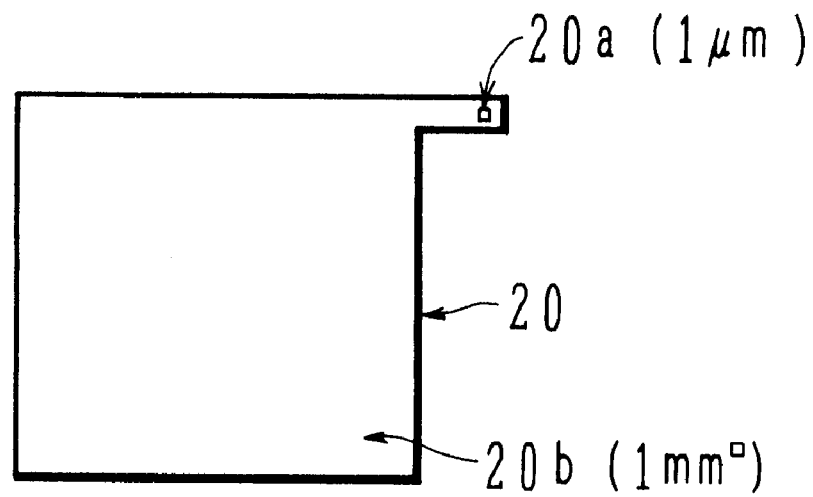
FIGS. 3A and 3B are a plan view and a cross sectional view explaining an experimental sample.
Figure 3B:
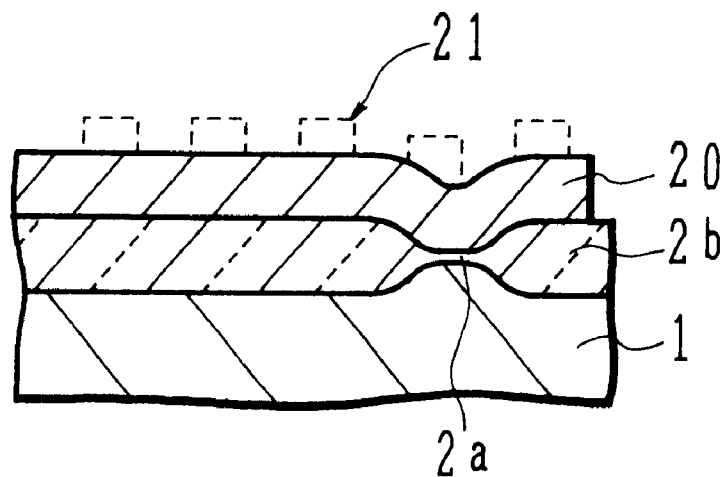

FIGS. 3A and 3B schematically show an experimental sample formed by the present inventors while taking the above-described viewpoint into consideration. FIG. 3A is a schematic plan view showing one unit of an experimental sample, and FIG. 3B is a schematic cross sectional view showing part or the experimental sample.

As shown in FIG. 3A, a conductive pattern 20 is formed on the surface of a semiconductor substrate with an insulating film being interposed therebetween. The conductive pattern 20 has a gate part 20a coupling via a thin gate film to the semiconductor substrate and a wide antenna part 20b disposed on a thick oxide film. Taking the above-described viewpoint into consideration, the present inventors formed a plurality of resist patterns having different pattern pitches on the conductive pattern 20.

FIG. 3B is a schematic cross sectional view of an experimental sample. An oxide film 2 is formed on a semiconductor substrate 1. The oxide film 2 is constituted by a thin gate oxide film 2a formed on the gate and a thick field oxide film 2b formed on other areas.

The conductive pattern 20 shown in FIG. 3A is formed on the oxide film 2. A resist pattern 21 of striped insulating resist is formed on the conductive pattern 20. The conductive pattern 20 is separated and insulated from the semiconductor substrate 1 by the oxide film 2.

A plurality of samples having resist patterns 21 of different aspect ratios were formed. Specifically, a sample of an aspect ratio of 0 without the resist pattern 21, a sample of an aspect ratio or about 0.7, and a sample of an aspect ratio of about 2 were mainly used. The resist pattern width and space were set to about 0.7 µm and the heights were set to 0.5 µm and 1.6 µm.

The gate oxide film 2a surrounded by the field oxide film 2b had a film thickness of about 8 nm and an area of 1×1 µm, and the area of the antenna part 20b was set to about 1×1 mm. The so-called antenna ratio was 1,000,000.

These samples having the antenna structure with and without a resist pattern were placed in plasma which had been uniformized by measuring a flat band voltage, and damages in antenna structures without resist pattern. Plasma was an ECR plasma, and rf bias of 2.3 W/cm$^2$ was applied.

Figure 4A:
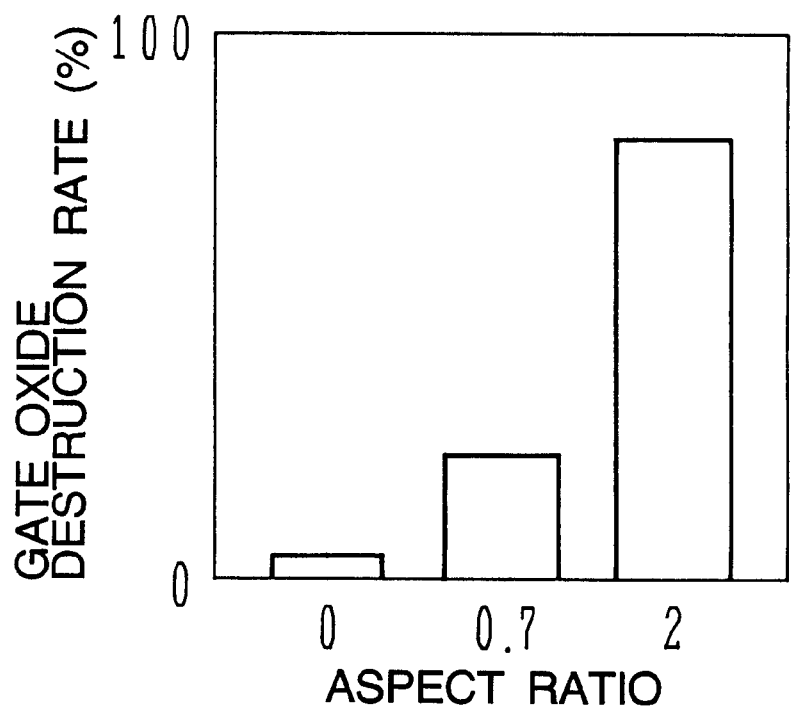
FIGS. 4A and 4B are a graph and a cross sectional view explaining the experiment results and analysis.

The samples were exposed in the plasma for about 30 see to measure damages. FIG. 4A is a graph showing the experiment results. As seen from the graph, the sample having an aspect ratio of 0 without a resist pattern scarcely showed destruction of the MOS gate oxide, which substantiated a conventional method of preventing damages by using uniform plasma. In other words, it can be said that uniform plasma was generated.

As the aspect ratio is increased to about 0.7 and to about 2.0, the gate destruction rate or the damage increases considerably. This phenomenon indicates that there are damages which cannot be prevented by a so-called uniform plasma.

As apparent from FIG. 4A, damages are generated even in the plasma which has no problem of non-uniformity from the viewpoint of a conventional judgement criterion. The destruction rate became larger the more the resist pattern becomes high.

It is conceivable that the same amounts of ion positive charges and electron negative charges reach an antennal conductor without a resist pattern. This proves a conventional understanding that damages are not generated in uniform plasma.

However, if a resist pattern is present, it can be hypothesized that charges are accelerated by a substrate RF bias generally in the direction perpendicular to the substrate, and ions are incident upon the antenna conductor whereas part of electrons having larger lateral speed components by scattering collide with the resist pattern and do not reach the antenna conductor.

It can be said from this that excessive positive charges become incident upon the antenna conductor and the MOS diode connected to the antenna conductor is destructed. It is conceivable that the degree of electron shielding becomes stronger as the resist pattern becomes higher, logically proving the experiment results shown in FIG. 4A.

The experimental samples were designed so as to make clear from the experiments that damages can be generated when a wiring layer is etched non-uniformly even if uniform plasma is used. This design is based upon a damage phenomenon experimentally discovered by the inventors.

The damages were round only on a wiring pattern having narrow spaces. The damages generated by etching the wiring layer were not largely dependent upon an overetching time. Damages were not likely to be generated at the initial stage of etching. These facts show that the damages must have been generated during a certain period near the endpoint of etching.

In etching an aluminum alloy, an etching speed lowers at the wiring pattern having a narrow space, this being a micro loading effect. Accordingly, if a pattern having both areas of wide and narrow spaces is etched, although the wiring area of a wide space has been etched completely, the area of a narrow space still has an unetched conductor which is connected in some cases to the gate electrode.

This conductor is in many cases separated from other conductors because the area of a wide pitch has been etched completely. As a result, if there is an imbalance between incident positive and negative charges, an excessive voltage is applied to the gate electrode.

This conductor is of tern connected to the substrate via a scribe line or the like at the initial stage of etching when the conductor spreads over the whole surface of the substrate. In such a case, the substrate is maintained to have the same potential as the conductor so that there is no potential difference across the gate insulating film. Under this condition, damages cannot be generated.

Even if the substrate is not directly connected to the conductor, if the conductor spreads over a large area, the potential of the conductor is averaged so that a large potential difference between the conductor potential and substrate potential is hardly generated.

Figure 4B:
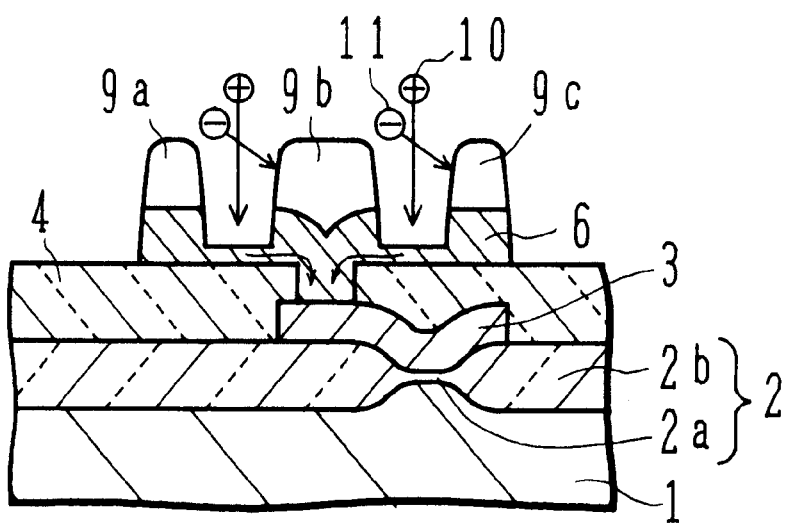

FIG. 4B is a schematic cross sectional view explaining the above-described circumstances. In etching an aluminum alloy, an etching speed lowers at the pattern having a narrow mask space, this being a micro loading effect. Accordingly, there occurs a case that although the conductor at the area of a wide wiring space has been already removed, the area of a narrow wiring space still has an unetched conductor.

In such a case, the gate electrode is connected to several conductors near the gate electrode, and separated from other conductors remote from the gate electrode. FIG. 4B shows such a case.

An insulating layer 2 is formed on a semiconductor substrate 1, and a gate electrode layer 3 is formed on the insulating layer 2. The surface of the gate electrode layer 3 is covered with an interlayer insulating film 4. A via-hole is formed on the gate electrode layer 3 at a local area thereof, the gate electrode layer 3 being connected to a wiring layer 6 via the via-hole.

The wiring layer 6 is first deposited on the whole surface of the substrate, and then patterned by using a photoresist film 9 as the etching mask. In FIG. 4B, only the wiring layer 6 portion just above the gate electrode layer 3 and the adjacent wiring layer portions are connected together.

The patten space between the photoresist, patterns 9a, 9b, and 9c is narrow. Accordingly, the wiring layers 6 between the photoresist patterns remain unetched because of the micro loading effect even if the wiring layer 6 outside of these photoresist patterns has been completely removed.

Ion positive charges 10 and electron negative charges 11 are incident upon the wiring layer 6. There are a number of electrons having the lateral direction components because of scattering. As a result, there are a number of electrons incident upon the side walls of the photoresist layer 9, whereas ion positive charges incident upon the wiring layer 6 are greater than electron negative charges.

Accordingly, positive charges flow more than negative charges into the gate electrode layer 3 connected to the wiring layer 6 so that the gate electrode layer 3 is charged to a positive polarity. When a charged potential exceeds a certain value, a tunnel current and dielectric breakdown discharge at the gate insulating film 2a start and the gate insulating film 2a is destructed.

It can be said that the experimental results shown in FIG. 4A substantiate the above-described model. The experimental samples were structured as shown in FIGS. 3A and 3B for the simplicity purpose. The structures of three samples are detailed in FIGS. 5A to 5D.

Figure 5A:
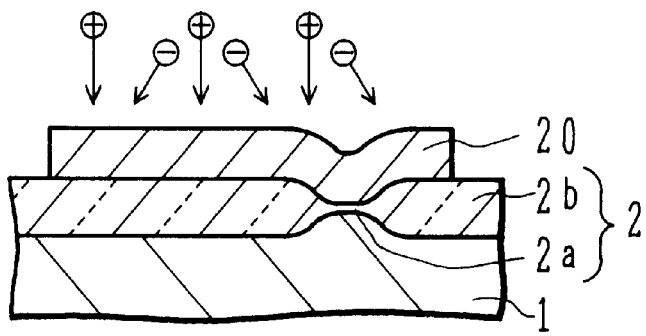
FIGS. 5A to 5D are cross sectional views and a plan view explaining the experiment conditions and analysis.

FIG. 5A shows a sample having an aspect ratio of 0. Formed on a semiconductor substrate 1 are a gate insulating film 2a and a field insulating film 2b extending from the gate insulating film 2b. A gate electrode layer 20 is formed on the gate insulating film 2a and field insulating film 2b. No photoresist layer is formed on the gate electrode layer 20, providing an aspect ratio of 0.

In the sample shown in FIG. 5I3, a gate electrode layer 20 has the same structure as the sample shown in FIG. 5A. A striped resist pattern 21 is formed on the gate electrode layer 20, the pattern 21 having a space of 0.7 µm and a width of 0.7 µm. The height of the resist pattern 21 is 0.5 µm, and the aspect ratio is about 0.7.

Figure 5D:
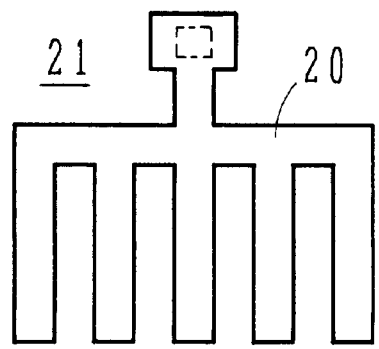
Figure 5B:
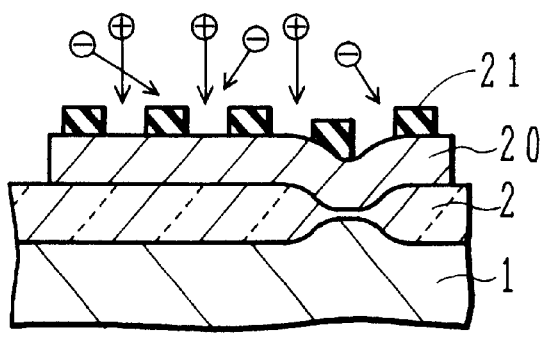
Figure 5C:
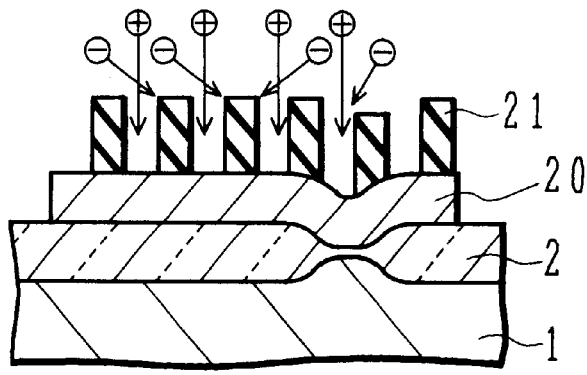

In the sample shown in FIG. 5C, a resist pattern like that shown in FIG. 5B is formed. This resist pattern has a height of 1.6 µm. The resist pattern space and width are 0.7 µm same as FIG. 5B, and the aspect ratio is about 2.

FIG. 5D is a schematic diagram showing the shape of the gate electrode layer 20 exposed under the resist pattern.

Ions and electrons in a plasma state are present on the surfaces of the samples. It is assumed that ion positive charges are incident upon the surface generally in the vertical direction and electron negative charges are incident obliquely upon the surface.

In the case of the aspect ratio of 0 shown in FIG. 5A, the same amounts of ions and electrons are incident upon the gate electrode layer 20. In the cases of FIGS. 5B and 5C, some of oblique electrons are incident upon the side walls of the resist pattern 21 and trapped thereat.

On the other hand, ion positive charges moving generally in the vertical direction through the openings on the surface of the resist pattern 21 are directly incident upon the gate electrode layer 20. Therefore, positive charges incident upon the gate electrode 20 are greater than negative charges.

As the height of the resist pattern 21 increases, the amount of negative charges trapped at the side walls increases so that the amount of positive charges incident upon the gate electrode layer 20 is greater than negative charges.

As described above, an imbalance between incident positive and negative charges occurs when a conductive layer covered with a fine resist pattern having a pattern space of about 1 µm or less is etched, if the motion directions of charges in plasma is anisotropic even if the plasma is uniform on a flat plane.

Figure 6A:
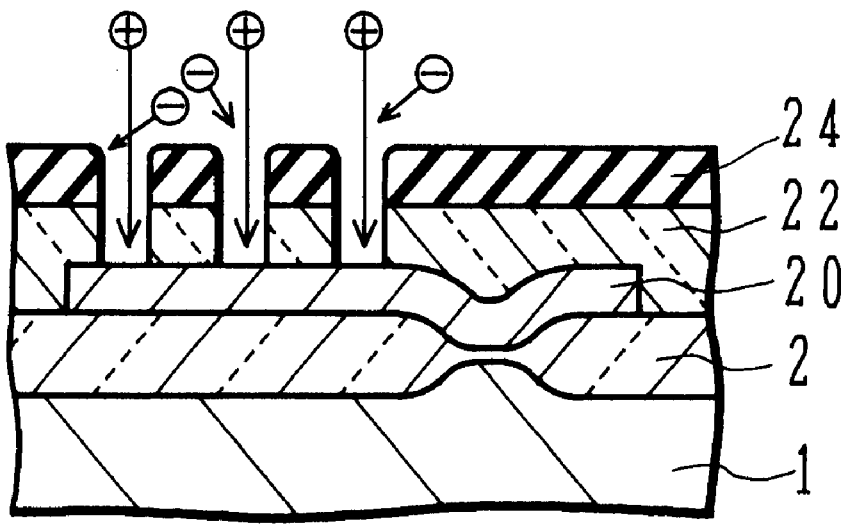
FIGS. 6A and 6B are cross sectional views showing other processes capable of applying the experiment results.
Figure 6B:
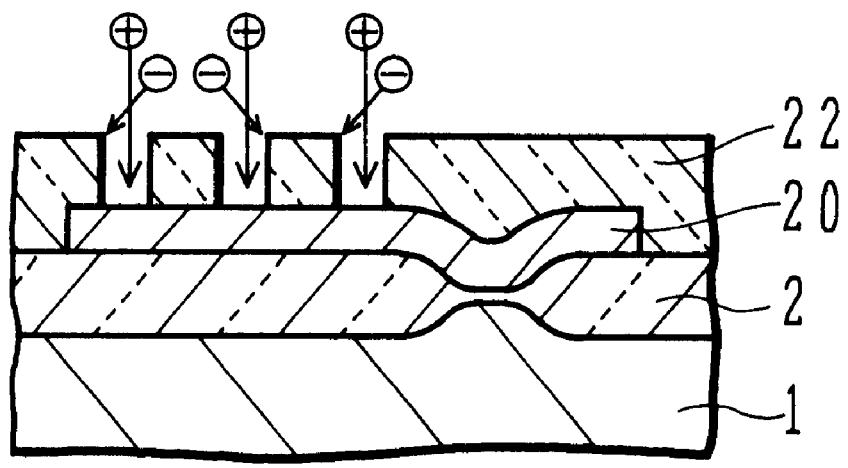

In the above experiments, a striped pattern was used. A mechanism causing excessive positive charges due to electron shielding and causing damages is not limited only to such a striped pattern. FIGS. 6A and 6B show other mechanisms by which damages were found by experiments and to which the above experiment results can be applied analogically.

FIG. 6A explains an etching process of contact holes. A gate electrode layer 20 is covered with an interlayer insulating film 22, and a resist pattern 24 is formed on the interlayer insulating film 22. The interlayer insulating film 22 is etched to form contact holes. Although the etching is stopped when a wiring layer 20 is exposed, the gate electrode layer 20 is in many cases electrically separated from other conductors.

When the gate electrode layer 20 is partially exposed, the etching still continues. In such a case, if there is an imbalance between positive and negative charges incident from the upper space, an excessive potential is generated at the gate electrode layer 20.

FIG. 6B explains a plasma cleaning process for contact holes. Contact holes formed by the process such as explained with FIG. 6A are cleaned by plasma before the contact holes are filled with a wiring layer such as metal.

In such a case, the gate electrode layer 20 exposes in the contact holes which are surrounded by an interlayer insulating film 22. If there is an imbalance between positive and negative charges incident from the upper space, an excessive potential is generated at the gate electrode layer 20 like the case of FIG. 6A.

It has been found as described above that damages are formed in a semiconductor device if the etching is performed by using an insulator as a plasma etching mask and by using plasma having a distribution of different directions of motions of positive and negative charges. It can be therefore thought or the following methods explained with FIGS. 1A to 1D as a means of preventing damages.

Figure 1A:
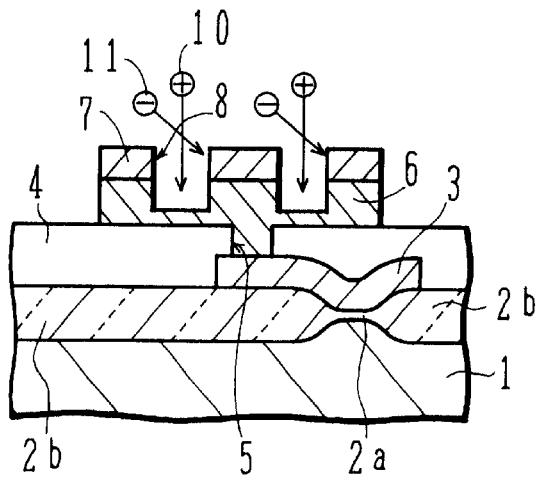
FIGS. 1A to 1D are schematic cross sectional views explaining the fundamental concept of the invention.

The method to be explained with FIG. 1A uses a conductive material as an etching mask. An insulating film 2 such as SiO2 is formed on the surface of an Si substrate 1, the insulating film 2 including a gate insulating film 2a and a field insulating film 2b. A gate electrode layer 3 is formed on the insulating film 2. The surface of the gate electrode layer 3 is covered with an interlayer insulating film 4.

A contact hole 5 is formed in the interlayer insulating film 4 to expose the gate electrode layer 3. A wiring layer 6 is formed on the interlayer insulating film 4 and connected to the gate electrode layer 3 via the contact hole 5.

An amorphous carbon (a-C) layer 7 as a conductive mask layer is formed on the wiring layer 6.

A resist layer is coated on the a-C layer 6 and patterned to form a resist mask. By using the resist mask as an etching mask, the a-C layer 7 is patterned. At least at the last stage of the etching, the resist layer on the a-C layer 7 is removed to expose the a-C layer 7.

Since this etching mask is conductive, all charges incident upon the etching mask flow to the wiring layer 6. As a result, so long as uniform plasma is used, positive and negative charges incident upon the wiring layer 6 and a-C layer 7 can be balanced.

Figure 1B:
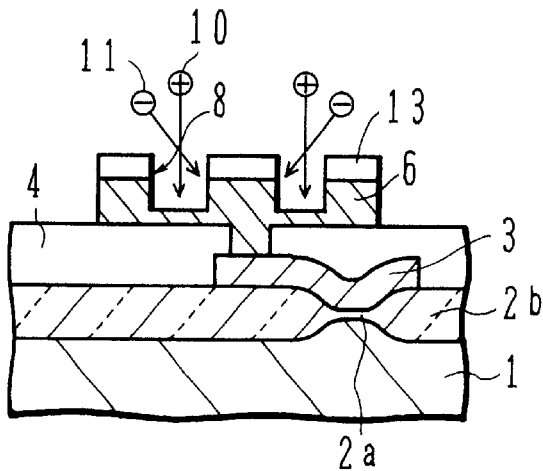

The method to be explained with FIG. 1B uses an insulating mask 13 as an etching mask by setting the thickness thereof to a predetermined value. The insulating mask 13 is thinner than a space of an opening 8 between patterns, and is set to a half of the space or thinner. Accordingly, even if electrons 11 are incident obliquely, the possibility of incidence of electrons upon the insulating mask 13 is very low.

Figure 1C:
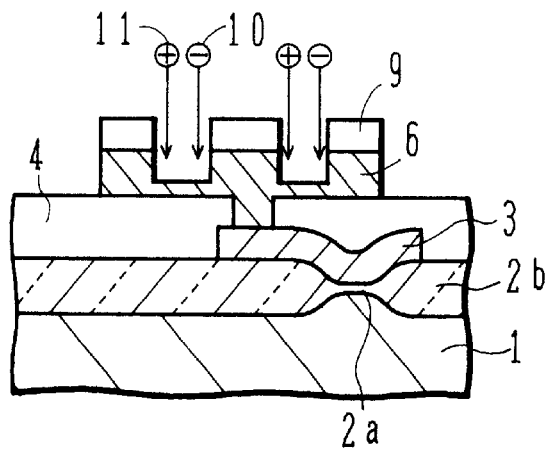

The method to be explained with FIG. 1C controls the plasma conditions so as to make the amount of positive charges equal to the amount of negative charges and make them incident in the vertical direction. Even if the etching is performed by forming a resist mask 9 on a wiring layer 6 in a conventional manner, if ions 10 and electrons 11 of the same charge amount are incident in the vertical direction, there is no charge-up of the wiring layer 6, thereby preventing damages.

In order to make ions and electrons of the same charge amount incident in the vertical direction, it is effective that uniform plasma is first generated in a conventional manner and then an RF bias having a low frequency of 1 MHz or lower is used. It is also effective to generate a cusp field by using a divergent magnetic field and an auxiliary magnetic field. It is also effective to generate a mirror field by using a divergent magnetic field and an auxiliary magnetic field.

Figure 1D:
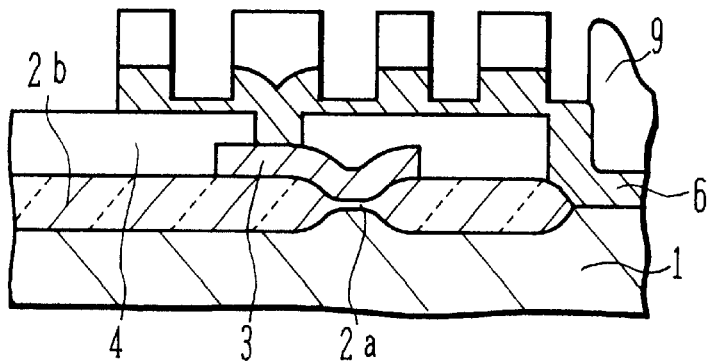

FIG. 1D shows the structure which makes the gate electrode and the wiring layer connected to the gate electrode hard to be electrically separated from the substrate even at the last stage of etching.

A wiring layer 6 is directly connected to an Si substrate I at a substrate contact of a ground wiring or the like. If a gate electrode layer 1 is separated from the wiring layer 6, damages are generated.

The phenomenon is positively used in which the etching is not completed at the area having a narrow pattern pitch and the etching is completed at the area having a wide pattern pitch. Both the wiring layer 6 directly connected to the substrate at a scribe line or the like and the gate electrode layer 3 are formed so as to have a predetermined narrow pattern pitch.

If the wide area having a wide pattern pitch is present in the wiring layer 6 and gate electrode layer 3, a dummy wiring layer is formed in the wide area so as not to form the area having a wide pattern pitch. The above-described methods will be detailed in the following.

FIGS. 7A to 7D and FIGS. 8A to 8D are cross sectional views showing the main processes of a method of manufacturing a semiconductor device according to an embodiment of the invention.

Figure 7A:
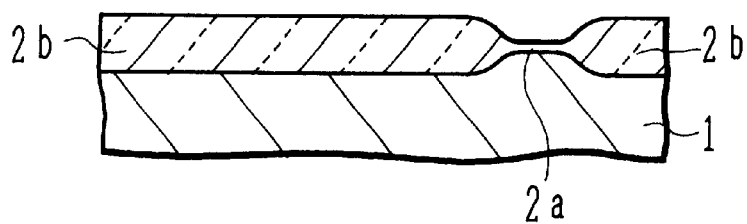
FIGS. 7A to 7D are cross sectional views explaining a method of manufacturing a semiconductor device according to an embodiment of the invention.

FIG. 7A illustrates a step of forming an oxide film 2 on an Si substrate 1. The surface of the Si substrate 1 is oxidized, for example, to about 5 nm. A silicon nitride film is deposited on the Si substrate 1 to a thickness of about 115 nm, and patterned to leave it only at the area where a field oxide film is not formed. Impurity ions are doped and thermally diffused to form a well if necessary. Channel stop impurity ions are doped.

By using the patterned silicon nitride film as an antioxidation mask, a field oxide film 2b is formed to a thickness of about 350 nm through selective oxidation of hydrogen burning oxidation. Thereafter, the silicon nitride film used as the antioxidation mask is removed.

Next, in a dry oxygen atmosphere, a sacrificial oxide film is formed to a thickness of about 15 nm at the active region, and impurity ions are doped for controlling a threshold value (Vth) of a MOS transistor. Next, the sacrificial oxide film is removed by diluted He aqueous solution. A gate oxide film 2a is formed to a thickness of about 8 nm on the exposed active region of the Si substrate, through oxidation in a dry oxygen atmosphere. In the above manner, the oxide film shown in FIG. 7A is formed.

Figure 7B:
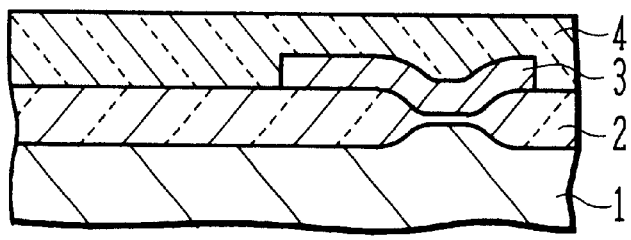

As shown in FIG. 7B, a gate electrode layer is formed on the oxide film 2, patterned to form a gate electrode 3. More in detail, an amorphous silicon film is deposited to a thickness of about 50 nm and a tungsten silicide film is deposited to a thickness of about 150 nm, by CVD. Impurity ions are doped in the gate electrode film formed in this manner. A cap oxide film is formed on the gate electrode firm to a thickness of about 60 nm by low pressure CVD. The cap oxide film and gate electrode film are patterned to form the gate electrode 3.

After the gate electrode 3 is patterned, impurity ions are doped into source/drain (S/D)) regions at the back and front sides of the drawing sheet of FIG. 7B to form S/D) regions.

Alternatively, in forming the S/D) regions, LDD regions are first formed by lightly doping impurity ions, an oxide film is grown by low pressure CVD, side wall spacers are formed by anisotropic etching, and impurity ions for forming the S/D regions are doped and activated through rapid thermal annealing (RTA) at 1000° C. to form the S/D regions.

In order to reduce the resistance of the gate electrode, metal silicide may be formed by self alignment (salicide) if necessary. For example, a Ti film is deposited to about 30 nm and reacted with Si in the active region by thermal process to thereby form a TiSi film.

After the gate electrode 3 is formed in the above manner, an interlayer insulating film 4 is formed by CVD. As the interlayer insulating film, a composite film such as a silicon oxynitride film and a spin-on-glass (SOG) film formed by plasma CVD may be used.

Figure 7C:
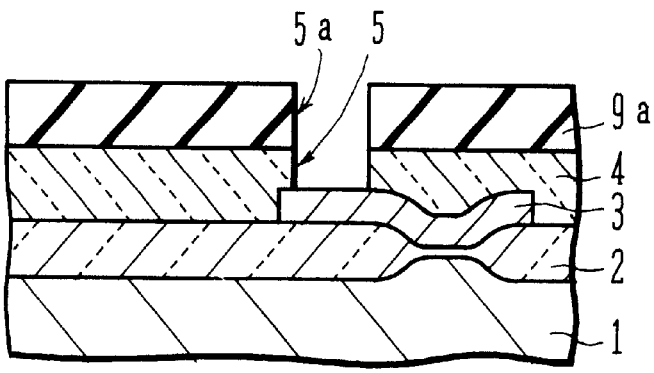

As shown in FIG. 7C a resist film 9a is formed on the interlayer insulating film 4, exposed and developed to form an opening 5a for a contact hole. By using the resist film 9a as an etching mask, the interlayer insulating film 4 is etched to form a contact hole 5 which passes through the interlayer insulating film 4 and exposes the gate electrode 3. Thereafter, the resist film 9a is removed through ashing or the like.

Figure 7D:
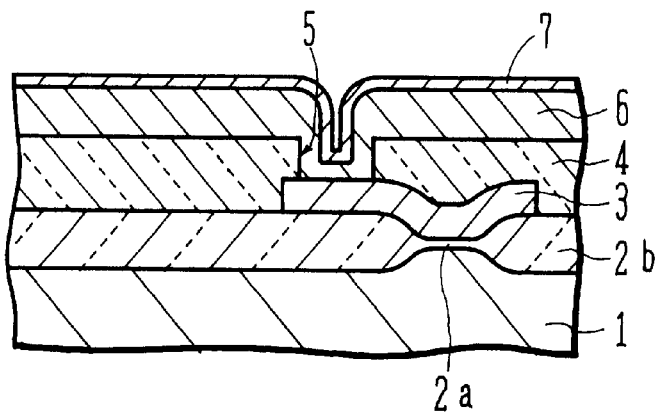

As shown in FIG. 7D, a wiring layer 6 is deposited by sputtering on the interlayer insulating film 4 having the contact hole 5. The wiring layer 6 is, for example, a laminated layer of a barrier metal laminated layer of a Ti layer of about 20 nm and a TiN layer of about 50 nm and an Al layer of about 1 $\mu$m sputtered on the barrier metal laminated layer. An amorphous carbon (a-C) film 7 is formed on the wiring layer 6 by sputtering or plasma enhanced CVD.

Thus, in the structure shown in FIG. 7D, the field oxide film 2b is formed to define the active region on the surface of the Si substrate 1, and the gate oxide film 2a is formed above the channel region in the active region. The gate electrode 3 is formed extending from the gate oxide film 2a to the field oxide film 2b. However, at this stage, the antenna ratio of the gate electrode layer i has still a low value.

On opposite sides of the gate electrode 3 in the vertical direction of the drawing sheet, the source and drain regions of a MOS transistor are formed. The wiring layer 6 connected via the contact hole 5 to the gate electrode 3 is formed over the whole surface of the substrate, and has a large antenna ratio of 10 or larger. Even after the wiring layer 6 is patterned, the antenna ratio may have a very high value depending upon the length of the wiring layer. For example, the antenna ratio is 100 or larger, in one case, 1000 or larger, and in another case, 10000 or larger. The a-C layer 7 has a thickness of, for example, about 0.2 $\mu$m and can be regarded as an appropriate conductor with respect to a charge-up.

Figure 8A:
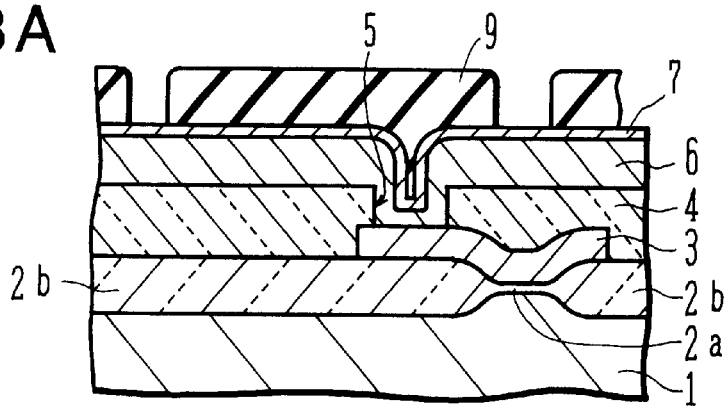
FIGS. 8A to 8D are cross sectional views explaining a method of manufacturing a semiconductor device according to the embodiment of the invention.

Next, as shown in FIG. 8A, a resist layer 9 is coated on the a-C layer 7, and exposed and developed to form a resist pattern 9 which has a minimum pattern space of about 0.8 $\mu$m.

Figure 8B:
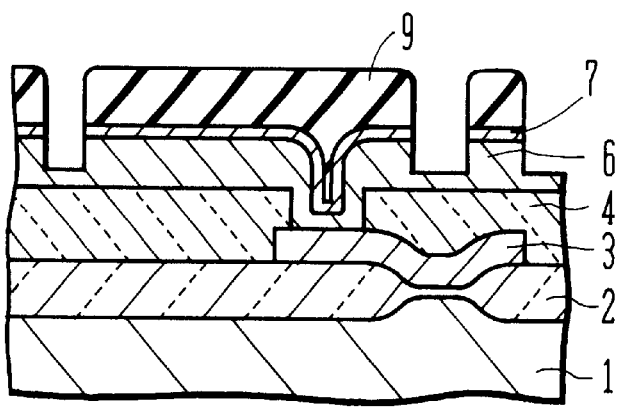

As shown in FIG. 8B, by using the resist pattern 9 as an etching mask, the a-C, layer 7 is selectively etched by plasma containing $CF_4$. After the a-C layer 7 has been selectively etched, the wiring layer 6 of aluminum alloy is etched by about 0.9 $\mu$m by plasma containing chlorine.

At this stage, the wiring layer 6 at the etched portion still has a thickness of about 0.1 $\mu$m so that the wiring layer 6 is electrically conductive over the whole surface of the substrate 1. As a result, even if there is a local imbalance between positive and negative charges incident upon the wiring layer 6, the potential of the wiring layer 6 as a whole is maintained stable.

After most of the wiring layer 6 has been etched the resist layer 9 is removed by oxygen plasma down-flow. The oxygen plasma down-flow has an excellent selectivity of etching. It is possible to etch the resist layer 9 and leave the a-C layer 7 unetched.

Figure 8C:
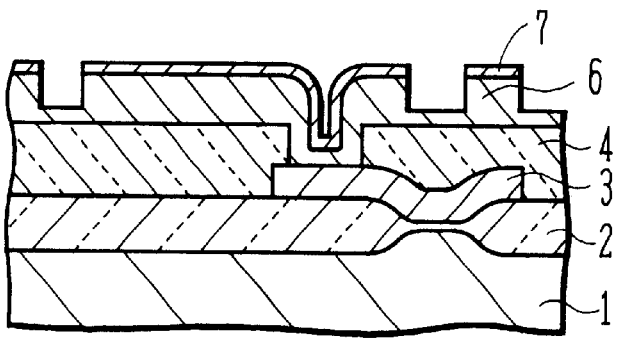

Next, as shown in FIG. 8C, by using the a-C layer 7 as an etching mask, etching the wiring layer 6 continues. For example, the etching is completed by plasma containing chlorine.

At the stage shown in FIG. 8C, the etching mask covering the wiring layer 6 is the conductive a-C layer 7 so that charges incident upon the a-C layer 7 can flow to the wiring layer 6. If the plasma is maintained uniform, charges are not accumulated in the wiring layer 6 and gate electrode layer 3.

Figure 8D:
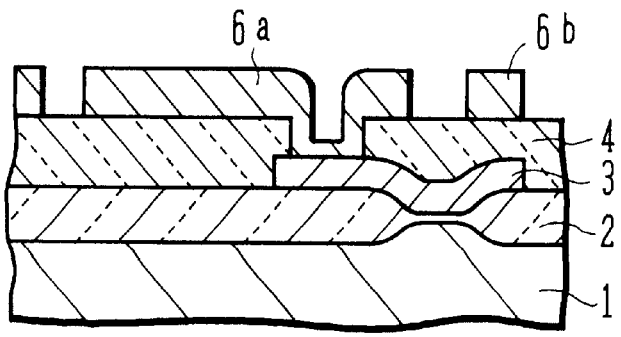

After the wiring layer 6 has been completely etched, the a-C layer 7 is removed by using oxygen plasma. FIG. 8D shows the state of the wiring layers 6a and 6a after the completion or etching.

At the etching process or FIG. 8B, electrons incident upon the resist layer 9 are shielded so that an imbalance is generated between positive and negative charges incident upon the wiring layer 6 and gate electrode layer 3. However, local imbalances are averaged as a whole and neutralized because the wiring layer 6 is maintained conductive over the whole surface of the substrate.

As a result, the etching process of FIG. 8B does not generate any damage. However, if the area caving a wide mask pitch of the wiring layer 6 has been etched completely, the wiring layer 6 is separated into each pattern allowing a charge-up to be generated. From this reason, it is necessary for the etching of FIG. 8B to stop before the wiring layer 6 is separated into each pattern.

At the last stage of etching, the device takes the state shown in FIG. 8C. Therefore, even if electrons are incident upon the side walls of the a-C, layer 7, the electrons flow from the a-C layer 7 to the wiring layer 6 to neutralize ions incident upon the wiring layer 6.

As described above, damages to be caused by the electron shielding by the insulating mask can be avoided by using a conductive a-C layer as an etching auxiliary mask.

The resistivity of an a-C film sputtered to a thickness of about 0.5 $\mu$m under the conditions of 10 mTorr and 1.5 kW was measured. It was about 0.25 $\Omega$cm.

Current generated by charged particles of plasma is in the order of about 10 mA/cm$^2$, and its instantaneous maximum value may be in the order of 1A/cm$^2$. If an a-C. film having the resistivity of about 0.25 $\Omega$cm and the film thickness of 1 $\mu$m is used as a mask, a potential difference in the film thickness direction is about 25 $\mu$V which is sufficiently small for preventing damages.

If a potential difference in the order of 1V is not present, damages of a gate insulating film will not be generated. Therefore, if a conductive film having a thickness of 1 $\mu$m is used, it can be used as a conductive mask under the conditions that it has a resistivity of about 10$^4$ $\Omega$cm or lower.

Another method may be thought of in which the thickness of a resist pattern is reduced so that, the resist pattern is removed during etching to automatically expose a conductive pattern. This method is however not preferable from the viewpoint of maintaining a pattern precision.

The reason for this is that lateral etching occurs at the upper end portion of an etching mask, generating a so-called off-set. If etching continues until the resist pattern is completely removed, the off-set progresses further and the resist pattern is deformed.

In the processes of FIGS. 8A to 8D, the main portion of etching, particularly the former half stage thereof, has been performed by using the resist mask as the etching mask. If the conductive mask has a sufficient thickness, the resist mask may be removed before etching the wiring layer.

FIGS. 9A to 9D are cross sectional views explaining the processes of a method of manufacturing a semiconductor device according to another embodiment of the invention. Similar to FIG. 8A, the device shown in FIG. 9A has an a-C, layer 7 formed on a wiring layer 6 of aluminum alloy or the like. In this embodiment, the thickness or the a-C layer 7 is set to about 0.7 $\mu$m, and the other structures are similar to those of FIG. 8A.

Figure 9A:
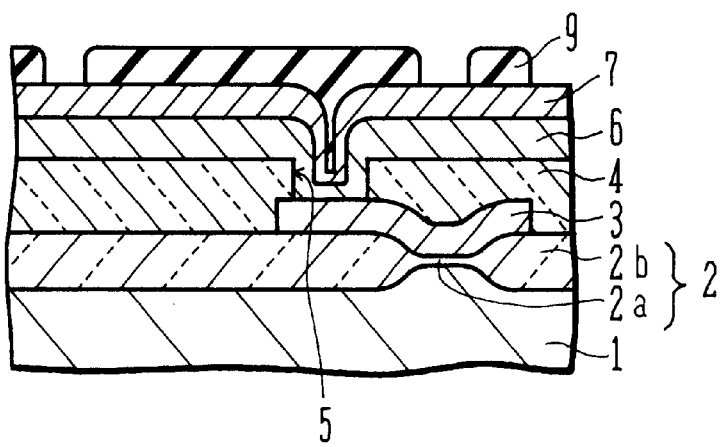
FIGS. 9A to 9D are cross sectional views explaining a method of manufacturing a semiconductor device according to another embodiment of the invention.
Figure 9B:
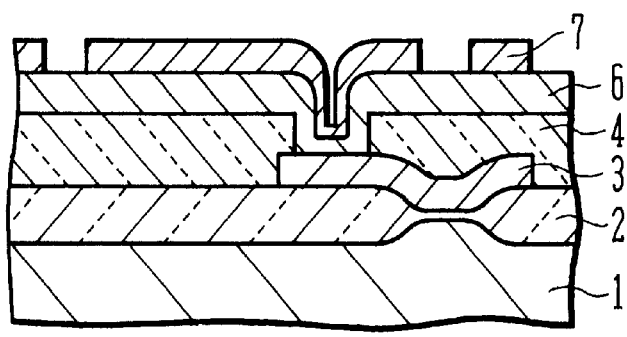

As shown in FIG. 9B3, by using a resist mask 9, the a-C layer 7 is selectively etched by plasma containing CF$_4$. Thereafter, the resist mask is removed by oxygen plasma down-flow. FIG. 9B shows the device after the resist mask has been removed.

Figure 9C:
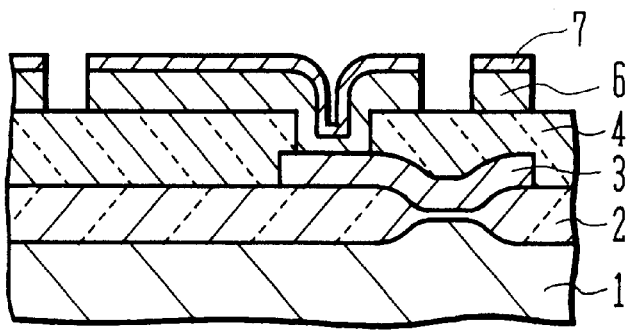

Next, as shown in FIG. 9C, by using the a-C layer 7 as an etching mask, the wiring layer 6 of an alumninum alloy is etched by plasma containing chlorine.

At the etching of FIG. 8C, the etching mask is the conductive a-C, layer 7 so that charges incident upon the side walls of the a-C layer 7 immediately flow to the wiring layer 6 and neutralize ions incident upon the wiring layer 6.

If the plasma is maintained uniform, the amounts of positive and negative charges incident upon the a-C. layer 7 and wiring layer 6 are generally same as a whole so that a good balance is maintained and damages are difficult to be generated.

Figure 9D:
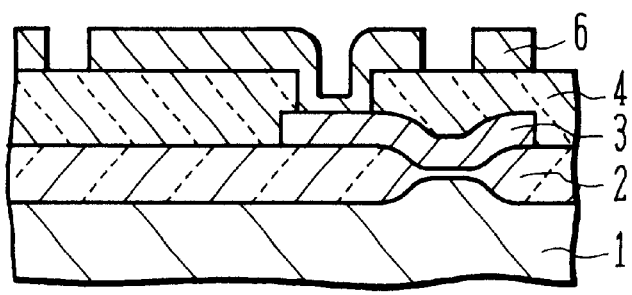

As shown in FIG. 9D, after the wiring layer 6 has been etched, the a-C film 7 is removed by plasma containing oxygen.

Oxygen plasma down-flow used for removing the resist on the a-C layer is suitable for selective etching because the etching speed of the a-C layer is low. If CF$_4$ is added, the ashing speed of the resist is raised.

Damages by plasma etching are generated when electrons incident upon the insulating resist mask on an electrically separated conductive layer are trapped by the resist mask.

If an etching mask can be made sufficiently thin, the amount of electrons incident upon the side walls of the etching mask is reduced correspondingly and the degree of damages is alleviated.

Figure 10A:
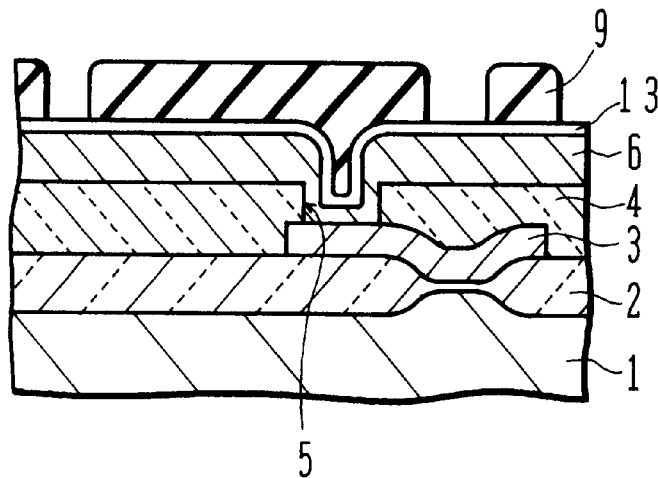
FIGS. 10A to 10C are cross sectional views explaining a method of manufacturing a semiconductor device according to a further embodiment of the invention.
Figure 10B:
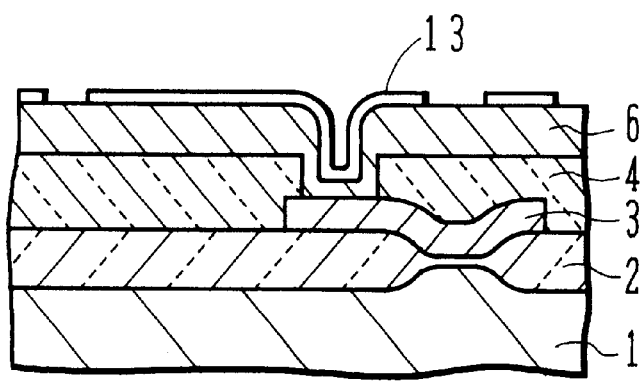
Figure 10C:
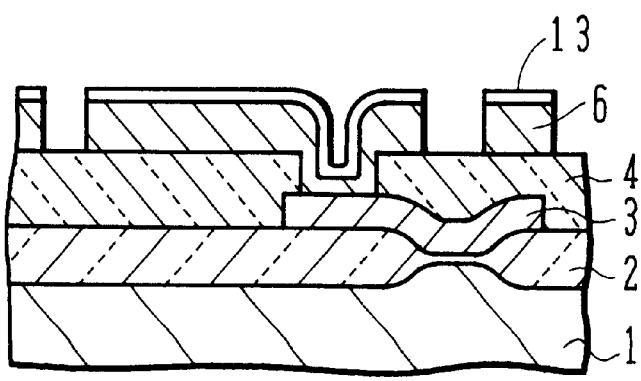

FIGS. 10A to 10C are cross sectional views explaining the processes of a method of manufacturing a semiconductor device according to another embodiment of the invention.

Referring to FIG. 10A, similar to the above-described embodiment, an insulating film 2 is formed on the surface of an Si substrate 1. A gate electrode layer 3 and an interlayer insulating film 4 are formed on the insulating film 2. A wiring layer 6 of aluminum alloy is formed to a thickness of, for example, 1 $\mu$m on the interlayer insulating film 4 and the gate electrode layer 3 exposed by an opening An SiO$_2$ film 13 having a thickness of, for example, about 0.3 $\mu$m is formed on the wiring layer 6 by plasma CVD. A resist layer is coated on the SiO$_2$ film 13 to form a resist pattern 9 having a minimum mask sp)ace of 0.8 $\mu$m.

By using the resist pattern 9 as an etching mask, the SiO$_2$ film 13 is selectively etched by plasma containing CF$_4$. After the SiO$_4$ film 13 has been etched, the resist pattern 9 is removed by oxygen plasma. If the resist is removed and the a-C. film is left, it is preferable to use plasma down-flow which provides good selectivity. However, in this embodiment, the underlying layer is SiO$_2$ so that oxygen plasma is used.

FIG. 10B shows the device with the resist pattern being removed. An etching mask 13 of the SiO$_2$ film is being formed on the wiring layer 6. The openings of the mask 13 have a width of about 0.8 $\mu$m and a height of about 0.3 $\mu$m. The area of the wiring layer 6 exposed in the openings is considerably large as compared to the side wall area of the SiO$_2$ film 13 exposed in the same opening.

As shown in FIG. 10C, by using the SiO$_2$ film 13 as an etching mask, the wiring layer 6 of aluminum alloy is etched by plasma containing chlorine. Uniformity of the plasma is ensured at the surface of the SiO$_2$ film 13 so that the amounts or incident positive and negative charges are equal and the charges are neutralized.

Although the balance between electrons and ions incident upon the side walls of the SiO$_2$ film 13 is not ensured, the thickness of the SiO$_2$ film is thin so that the imbalance between charges is small. As a result, the imbalance between positive and negative charges incident upon the wiring layer 6 under the SiO$_2$ is also small.

It is conceivable that the electron shielding is alleviated by reducing the height of the mask and that micro loading effect is also alleviated by reducing the height of the openings.

Figure 11:
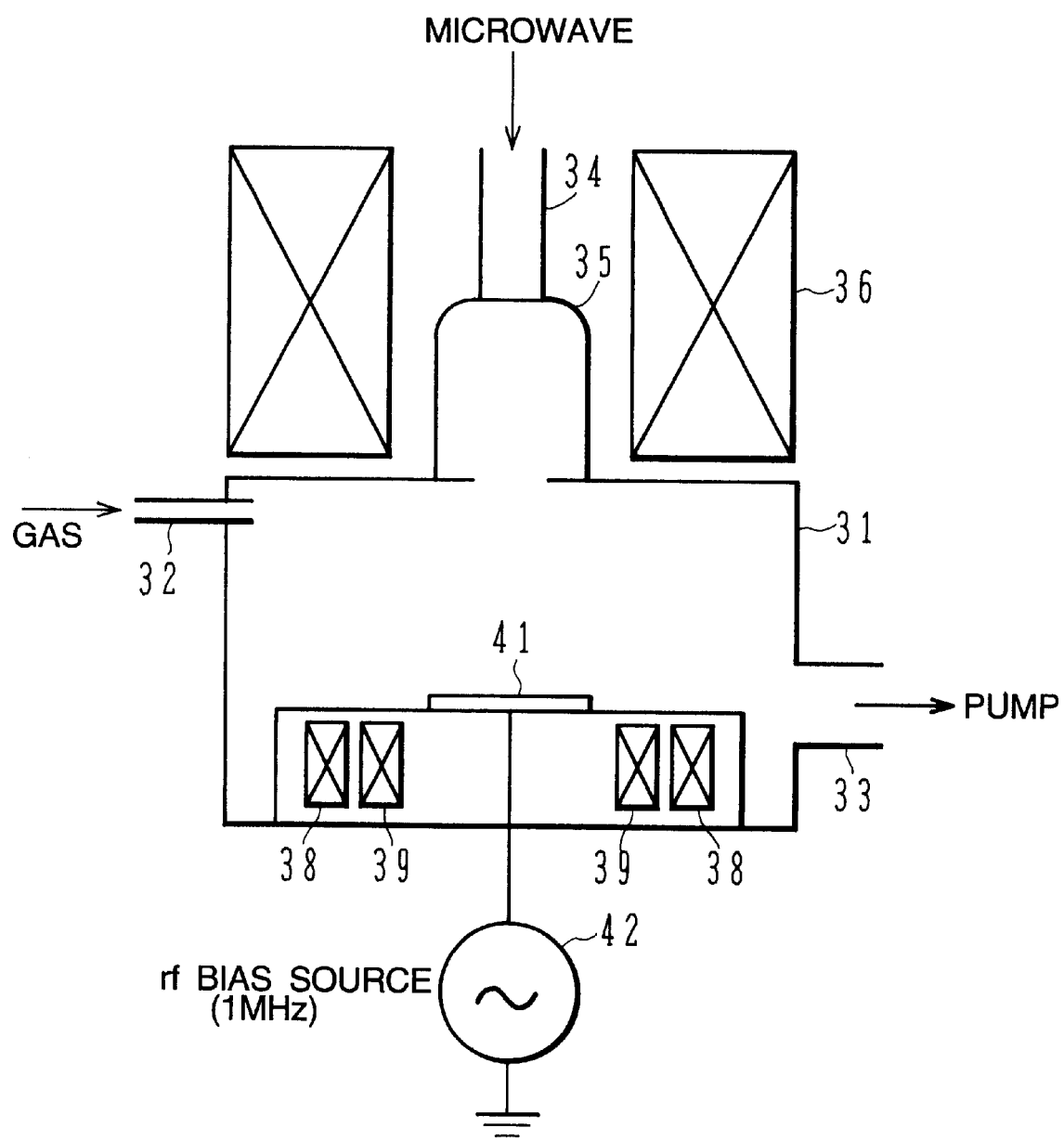
FIG. 11 is a schematic cross sectional view of a plasma etching system to be used for the embodiments of the invention.

FIG. 11 is a schematic cross sectional view of a plasma etching system which is used for explaining plasma etching, according to an embodiment of the invention. A hermetic plasma chamber 31 is provided with a gas inlet port 32 and a gas exhaust port 33. The gas inlet port 32 is connected to an etching gas source, and the gas exhaust port 33 is connected to a gas exhausting apparatus.

A plasma generating chamber 35 is coupled to the plasma chamber 31 at its upper position, and is communicated with a microwave guide tube 34 via a hermetic window. A main coil 36 is disposed around the plasma generating chamber 35 to generate a divergent magnetic field in the chambers 31 and 35.

While a micro wave is introduced from the microwave guide tube 34 to the plasma generating chamber 35, a magnetic field is generated in the plasma generating chamber by the main coil 36 so that an ECR plasma of a desired shape can be generated in the plasma generating chamber 35. This plasma moves to the plasma chamber 31 and collides with a substrate placed on a susceptor 41.

An outer coil 38 and an inner coil 39 of a ring shape are disposed under the susceptor 41, the susceptor being connected to an RI bias source 42.

The conditions of setting the same amount of ions and electrons moving in the direction perpendicular to the substrate were obtained by using the divergent magnetic field type ECR plasma etching system described above. Specifically, a number of samples having a dense striped pattern with a pattern space of 0.8 $\mu$m were formed on a substrate, and the substrate was placed on the susceptor to detect the generation of damages.

A number of MOS capacitors having an antenna with an antenna ratio of 10$^6$ were formed on the substrate, and the antenna conductor of aluminum alloy was etched by a mixed gas of Cl$_2$+BCl$_3$ at a pressure of 0.6 Pa. Table 1 shows the generation of damages formed by the divergent magnetic field type ECR plasma etching system.

The RF bias frequency used was typically 13.56 MHz and 400 kHz, and current flowing through the coils 38 and 39 were changed. When the current sign is positive, coil 38 generates a magnetic field having a direction opposite to the magnetic field generated by the main coil 36, and the coil 39 generates a magnetic field having a direction same as that of the magnetic field generated by the main coil 36.

TABLE 1

| RF bias frequency | Coil 38<br>Coil 39 | 8A<br>8A | 8A<br>−8A | 0A<br>16A | 0A<br>−16A |
|---|---|---|---|---|---|
| 13.56 MHz | | Damage | No damage | — | Damage |
| 400 kHz | | No damage | No damage | No damage | No damage |

As seen from the experiment results shown in Table 1, damages were reduced and good results were obtained at a low RF bias frequency.

Damages were reduced depending upon the conditions of the magnetic fields generated by the coils 38 and 39 even at a high RF bias frequency. Similar dependency was also confirmed by the evaluation of threshold values Vth of MOS transistors having the same antenna structure.

As described previously, it is conceivable that damages are generated because electrons are difficult to reach the conductor between antenna patterns resulting from the micro loading effect and consequently ion positive charges become excessive. The micro loading effect was substantially not changed even if the RF bias Frequency is lowered, so that it can be supposed that the dynamical state of electrons changes with a change in the RF bias frequency.

It can be assumed therefore that by lowering the substrate bias Frequency, preferably to 1 MHz or lower, electrons are accelerated toward the substrate and the amount of electrons shielded by the resist pattern reduces Plasma non-uniformity as conventionally defined is not present even if the divergence magnetic field type ECR etching system is operated at the RF bias frequency of 13.56 MHz.

It is conceivable that, the same tendency as above is satisfied by using helicon plasma, inductively coupled plasma, transformer coupled plasma, or DECR plasma.

It is conceivable that damages can be suppressed by setting a bias frequency to about 1 MHz or lower if a substrate is exposed to plasma generated by such, high density plasma sources and applied with an RF power from the lower position of the substrate.

Figure 12:
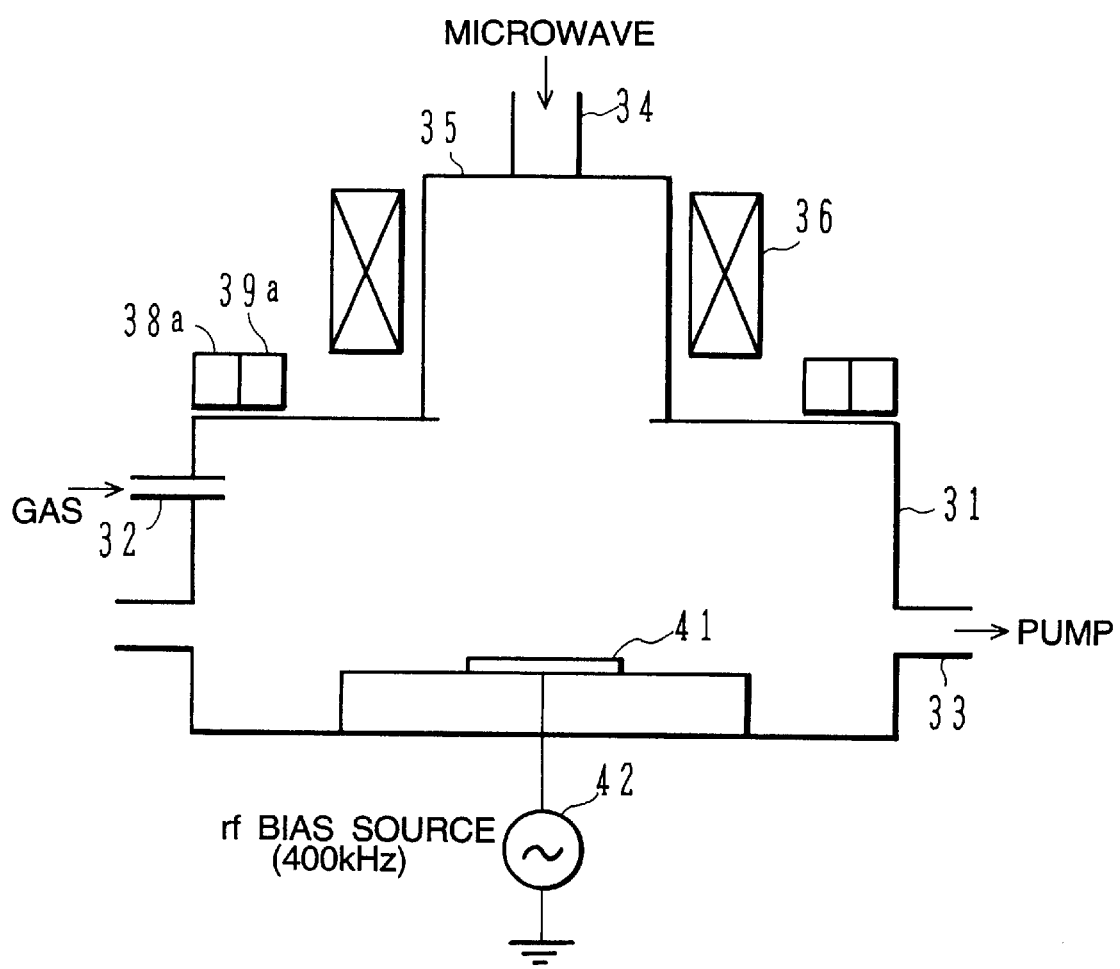
FIG. 12 is a schematic cross sectional view of another plasma etching system to be used for the embodiments of the invention.

FIG. 12 is a schematic cross sectional view of a plasma etching system which is used for Explaining plasma etching, according to another embodiment of the invention. This plasma etching system has an outer auxiliary coil 38a and an inner auxiliary coil 39a respectively disposed at the upper position of the plasma chamber 31 and at the outside of the main coil 36. The other structures are similar to those of the etching system shown in FIG. 11.

The conditions of setting the same amount of ions and electrons moving, at least near patterns, in the direction perpendicular to the substrate were obtained by using the divergence magnetic field type ECR plasma etching system described above. Specifically, a number of samples having a dense striped pattern with a pattern space of 0.8 $\mu$m were formed on a substrate to detect the generation of damages. The antenna ratio was 10$^6$ same as the embodiment described with FIG. 11.

The antenna conductor of aluminum alloy was etched by a mixed gas of Cl$_2$+BCl$_3$, at a pressure of 0.53 Pa. The bias frequency of the RF bias source 42 was set to 400 kHz, and the currents flowing through the outer and inner coils 38a and 39a were changed. The current forming a magnetic field having a direction same as the magnetic field generated by the main coil is represented as a positive current value, and the current forming a magnetic field having a direction opposite to the magnetic field generated by the main coil is represented as a negative current value. The experiment results are summarized in Table 2.

TABLE 2

| RF bias frequency 400 kHz | Coil 38a | −16A | −8A | 0A | 8A | 16A | 0A |
|---|---|---|---|---|---|---|---|
| | Coil 39a | −16A | −8A | 0A | 8A | 16A | 20A |
| | | Damage | Damage | Damage | Less damage | No damage | |
| 13.58 MHz | | | | | | | damage |

As seen from the experiment results shown in Table 2, damages were reduced and good results were obtained by making the outer and inner coils 38a and 39a generate the magnetic field having a direction same as that of the magnetic field generated by the main coil 36. Plasma non-uniformity as conventionally defined is not present under all the conditions shown in Table 2. It is therefore conceivable that damages are generated because electrons are difficult to reach the conductor between antenna patterns resulting from the micro loading effect and consequently ion positive charges become excessive. The micro loading effect was substantially not charged depending upon the currents flowing through the auxiliary coils 38a and 39a, so that it can be supposed that the amounts of ions and electrons moving, at least near the patterns, in the direction perpendicular to the substrate are made equal by the mirror magnetic field having the same direction as the main magnetic field. It is also noted that when the RF frequency is as high as 13.56 MHz and the coil 39a allows a current of 20A to flow, damages were observed.

Figure 13A:
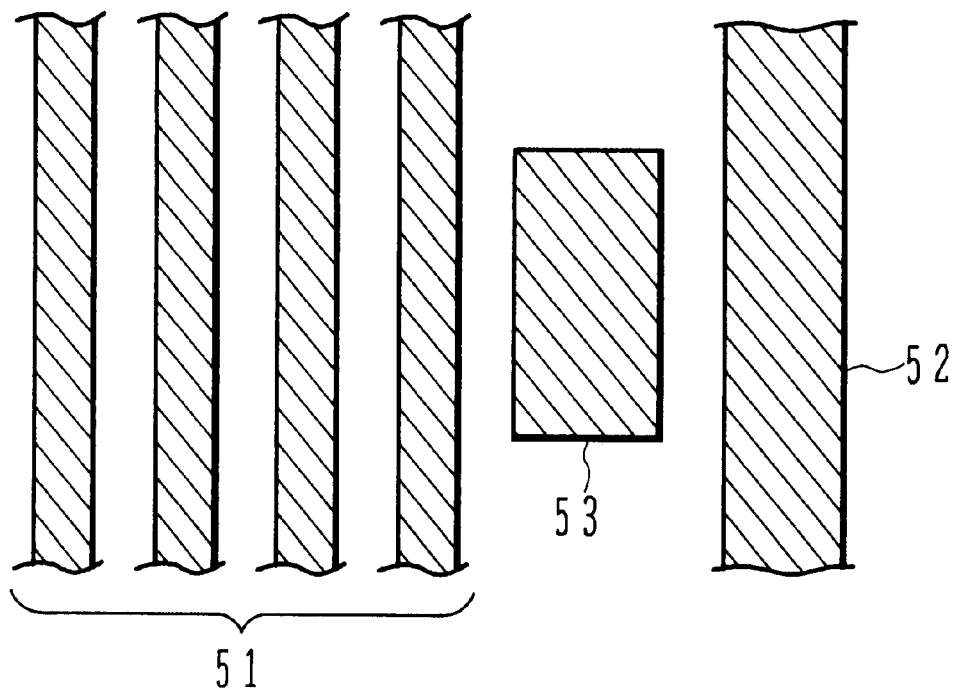
FIGS. 13A and 13B are plan views of wiring patterns to be used for the embodiments of the invention.
Figure 13B:
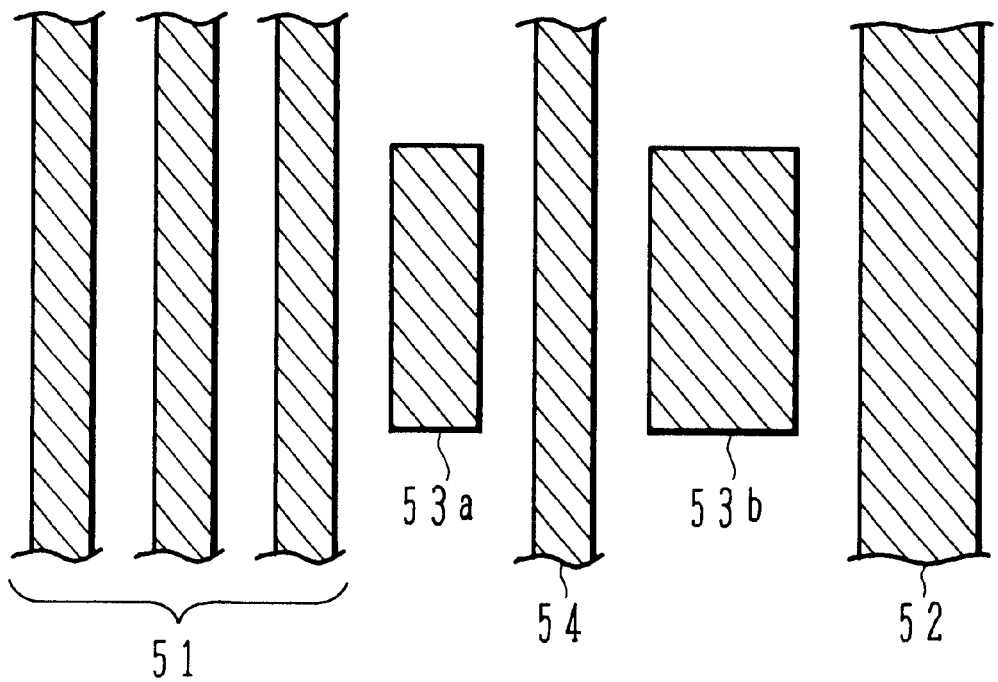

FIGS. 13A and 13B are plan views explaining a method of manufacturing a semiconductor device according to another embodiment of the invention.

FIG. 13A shows wiring patterns to be formed on a substrate. A wiring group 51 has a high antenna ratio and is connected to gate electrodes.

A power source wiring 52 is connected to a semiconductor substrate or a well. It is not necessary to form any wiring between the wiring group 51 and the wiring 52 from the viewpoint of an integrated circuit. Then, a wide space will be produced between the wirings 51 and 52.

In such a case, according to a conventional technique, the conductor at the wide space between the wirings 51 and 52 can be easily etched, whereas the conductors between the wiring group 51 are not still removed even at the end of the etching because of the micro loading effect.

In such a case, an interpolation or dummy pattern 53 is formed at the wide space between the wirings 51 and 52 to thereby realize a uniform pattern space as much as possible. Specifically, the interpolation pattern 53 is disposed so as to have the pattern space same as the minimum pattern pitch of the wiring group 51.

The pitch of the wiring group 51, the pitch between the interpolation pattern 53 and the wiring group 51, and the pitch between the interpolation pattern 53 and the power source wiring 52, are made generally equal. As a result, the micro loading effects of substantially the same degree are provided and the pattern etching speeds are uniformized. Accordingly, it is possible to prevent a partial cut of a wiring layer and a flow of excessive charges into gate electrodes.

In the patterns shown in FIG. 13B, a signal wiring 54 is disposed between a wiring group 51 having a high antenna ratio and a power source wiring 52, and relatively wide spaces are disposed on both sides of the signal wiring 54.

Also in this case, interpolation patterns 53a and 53b are formed at the wide spaces on the both si des of the signal wiring 54 so as to make the areas on the both sides of the interpolation patterns 53a and 53b have generally the same pattern pitch as that of the wiring group 51 having a high antenna ratio.

By forming a pattern layout having uniform minimum pattern pitches by inserting interpolation patterns in the above manner, it is possible to provide uniform micro loading effects and control the time when the wiring group 51 having a high antenna ratio is separated from the power source wiring 52 so as to coincide with the timing of the end of etching. Accordingly, irregularity of charges accumulated in gate electrodes can be corrected and damages are suppressed.

All the above-described embodiments are effective for forming a wiring layer, particularly a wiring layer having a high antenna ratio.

Figure 14A:
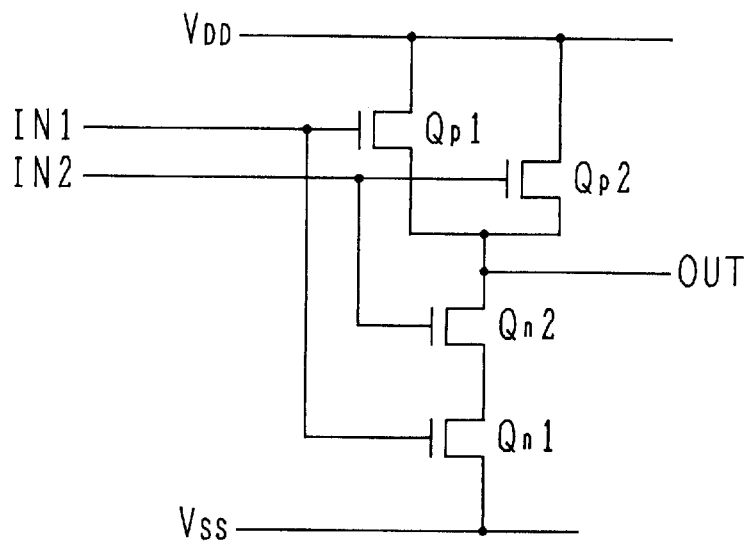
FIGS. 14A and 14B are an equivalent circuit diagram of a NAND circuit suitable for use with the embodiments of the invention, and a schematic diagram showing the layout of the NAND circuit.
Figure 14B:
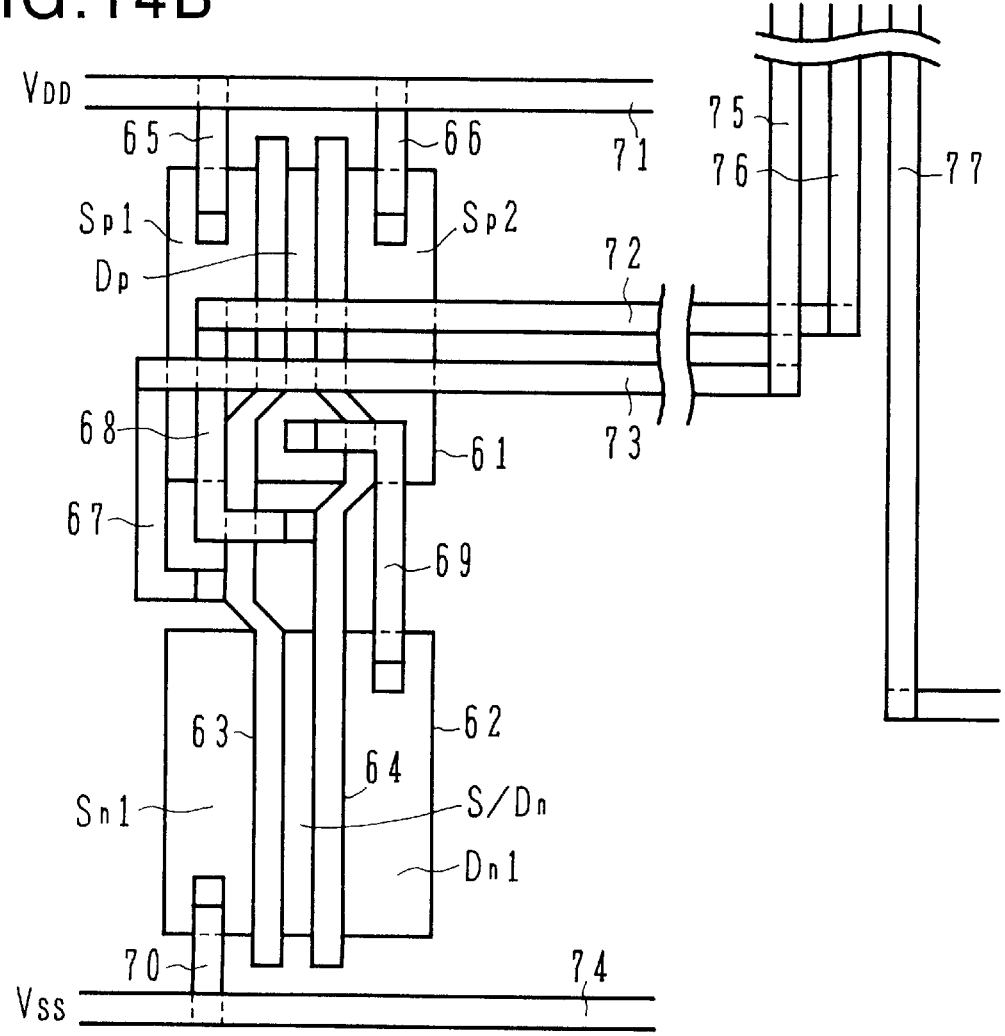

FIGS. 14A and 14B show an example of a circuit which is likely to have a high antenna ratio. FIG. 14A is an equivalent circuit of a NAND circuit. A two-input NAND circuit is connected between a power source wiring $V_{DD}$ and a ground wiring $V_{SS}$. The sources of two p-channel MOS transistors Qp1 and Qp2 are connected to the power source wiring $V_{DD}$, and the drains thereof are connected in common. The drains are connected to a serial circuit of two n-channel MOS transistors Qn1 and Qn2, and the source of the n-channel MOS transistor Qn1 is connected to the ground wiring $V_{SS}$.

The wiring for an input signal IN1 is connected to the gate electrodes of the p-channel MOS transistor Qp1 and n-channel MOS transistor Qn1. The wiring for another input signal IN2 is connected to the gate electrodes of the p-channel MOS transistor Qp2 and n-channel MOS transistor Qn2.

An output signal OUT is picked up from the interconnection point between the drains of the two p-channel MOS transistors Qp1 and Qp2 and the n-channel MOS transistor Qn2.

The logic circuit of this NAND gate receives input signals from a logic circuit at the preceding stage. The logic circuit at the preceding stage is not necessarily positioned near the succeeding logic circuit, and in some cases, an input signal wiring becomes very long. These cases occur in microprocessors, ASIC's (application specific IC's), ASSP's (application specific standard products), gate arrays, and the like.

Countermeasures against damages of general memory devices are possible by performing an antenna ratio inspection at the time of designing, and changing the element layout and wirings to lower the antenna ratio, insert protective elements, and etc. The This can be done because design automation is relatively at a low degree.

In contrast with this, an advanced automation by CAD has been prepared for logic circuit devices, in the range from function and logic design, gate level design, to layout design. Even if an antenna ratio inspection is performed, wiring change and insertion of protective elements require a large design cost. It is therefore difficult to change device design as countermeasures against damages of logic circuit devices.

FIG. 14B is a plan view showing an example of the layout of the NAND circuit shown in FIG. 14A. An n-well 61 for forming p-channel MOS transistors and a p-well 62 for forming n-channel MOS transistors are positioned near each other. Gate wirings 63 and 64 pass over the n- and p-wells 61 and 62.

By using the gate wirings 63 and 64 as a mask, ions are doped to form p-type source regions Sp1 and Sp2 and a p-type drain region Dp in the p-type well 62. Also by using the gate wirings 63 and 64 as a mask, ions are doped to form an n-type source region S/Dn, an n-type drain region Dn1, and a source/drain region S/Dn in the p-well 62.

A first wiring layer for wirings 65 to 70 is formed on the surface of the device constructed as above. An interlayer insulating film is formed covering the first wiring layer. Contact holes are formed in the interlayer insulating film, and thereafter a second wiring layer for electrodes 71 to 74 is formed. Another interlayer insulating film is formed covering the second wiring layer in which contact holes are formed. A third wiring layer for wirings 75 to 77 is formed on tile second wiring layer.

For example, after the gate electrodes 63 and 64 have been formed, the first wiring layer is formed with the electrodes 67 and 68 being connected to the gate electrodes 63 and 64. In the example shown in FIG. 14B, the antenna ratio at this stage is not so high. However, the wirings 72 and 73 of the second wiring layer may become very long depending upon the layout design. The antenna ratios of the wirings 72 and 73 are determined by the exposed surface areas of the wirings 72 and 73 relative to the intrinsic gate areas of the gate electrodes 63 and 64. The wiring area connected to the exposed wirings 72 and 73 functions to raise the effective antenna ratio until they are separated.

The third wiring layer is formed with the wirings 75 and 76 being connected via the wirings 72 and 73 to the gate wirings 63 and 64. There is a high possibility of forming the third wiring layer having a high antenna ratio. The wiring 77 also functions to raise the antenna ratio.

Figure 15:
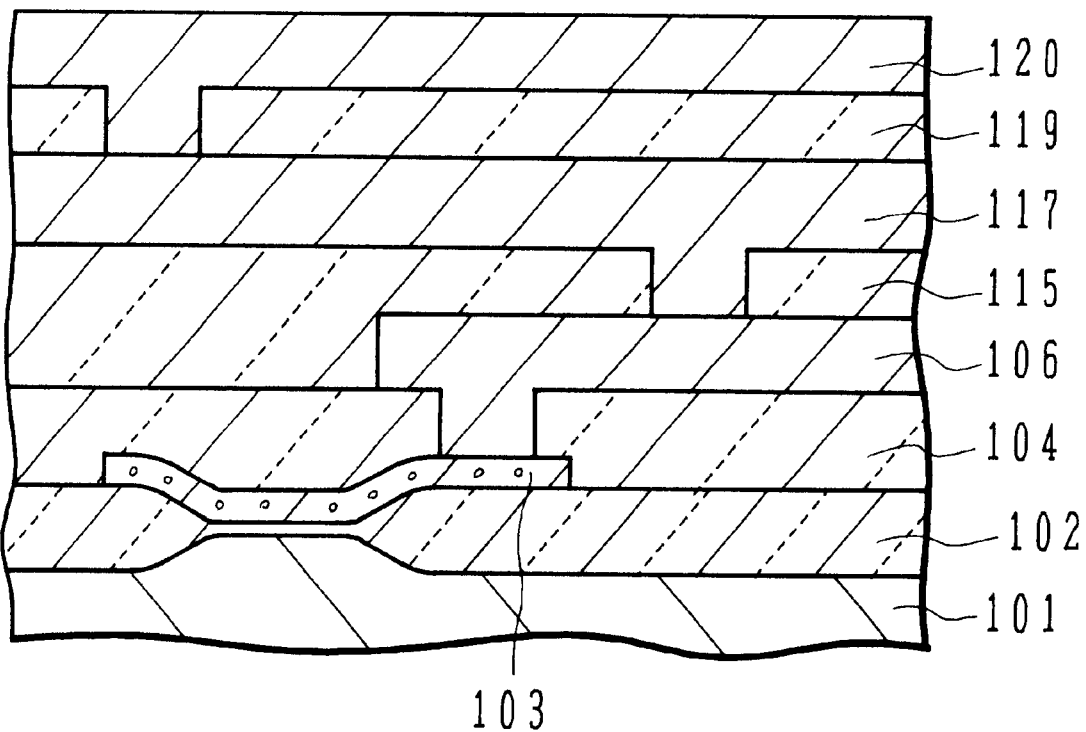
FIG. 15 is a schematic cross sectional view showing the structure of a semiconductor device having multi-layer wirings.

FIG. 15 is a schematic cross sectional view showing such a multi-layer structure. The structure similar to that shown in FIG. 2A is formed up to a first wiring layer 106. On the first wiring layer 106, there are formed an interlayer insulating film 115, a second wiring layer 117, an interlayer insulating film 119, and a third wiring layer 120. The third, second, and first wiring layers 120, 117, and 106 are connected to gate electrodes.

The above embodiments are effective particularly for forming logic circuits.

The present invention has been described in connection with the preferred embodiments. The invention is not limited only to the above embodiments. For example, a gate electrode of a MOS transistor or a wiring layer connected to the gate electrode may be formed not only by polycrystalline silicon but also by refractory metal polycide (e.g., a laminated layer of polycrystalline Si and refractory metal (such as W)), metal such as silicide, or TIN. Silicon may be amorphous silicon during the manufacturing process.

An a-C layer may be etched by etchant gas such as $CF_4$, $Cl_2$, and $BCl_3$. Al and Al alloy may be etched by etchant gas containing chlorine such as $Cl_2$ and HCl. Resist and a-C may be etched by $O_2$. Plasma etching may use various plasmas such as RF plasma and microwave plasma.

As a conductive mask, amorphous carbon has been described. If a wiring layer is Al, W may be used as the conductive mask and Br-based gas may be used as an etchant.

If a wiring layer is W, the conductive mask may be Al, TiN or the like and F-based gas may be used as an etchant. If a wiring layer is W silicide or polycide, similar combinations may be used. Any combination of a wiring layer and a conductive mask may be used if it provides a high etching selectivity and a sufficient conductivity of the masks.

As the pattern pitch, 0.7 μm and 0.8 μm have been described. If the pattern pitch is about 1 μm or less, a distinctive micro loading effect can be obtained so that the present invention is applicable.

It is obvious to those skilled in the art that various changes, improvements, combinations and the like may be made without departing from the scope and spirit of the appended claims.

What is claimed is:

1. A method of manufacturing a semiconductor device comprising the steps of:

providing conditions of first plasma generated with a plasma exciting means and an RF bias applied to a first test workpiece to be etched and having a first frequency above 1 MHz, the first plasma satisfying an electrically neutral condition on a top surface of the first test workpiece; and etching either a wiring layer connected to an insulated gate of an insulated gate type field effect transistor or an insulating layer on the wiring layer by using an insulating mask having an opening, the aspect ratio of which is at least 0.7, and a second plasma generated above the surface of a second productive workpiece to be etched by the plasma exciting means of said conditions, and another RF bias being different from said plasma exciting means and having a maximum frequency of 1 MHz applied to said second productive workpiece so as to make the amounts of ions and electrons incident upon the surface of said wiring layer exposed in said opening generally equal to each other preventing charge-up of the wiring layer and hence damage.

2. A method according to claim 1, wherein a divergent main magnetic field gradually reducing magnetic flux densities and an auxiliary magnetic field having a same direction as said divergent main magnetic field are applied to said second productive workpiece.

3. A method according to claim 1, wherein said second plasma is generated under a divergent main magnetic field gradually reducing a magnetic flux density above the surface of the second productive workpiece, and a first auxiliary magnetic field having an opposite direction to said divergent main magnetic field is applied on the second productive workpiece.

4. A method according to claim 1, wherein said plasma exciting means is a micro wave.

5. A method according to claim 1, wherein said plasma exciting means is one of electron cyclotron resonance, helicon, inductive coupling, transformer coupling, and DECR.

6. A method according to claim 1, wherein said second workpiece is placed in a position where said generated second plasma is directed.

7. A method according to claim 1, wherein said wiring layer includes a surface area A which faces to another conductive surface through an insulating film and an exposed surface area B which is at least ten times as broad as said surface area A, B≧10A.

8. A method according to claim 2, wherein said auxiliary magnetic field is generated by a coil disposed below said second productive workpiece.

9. A method according to claim 2, wherein said auxiliary magnetic field is generated by a coil disposed above said second productive workpiece.

10. A method according to claim 3, wherein in another auxiliary magnetic field having a same direction as said divergent main magnetic field is superposedly applied on the second productive workpiece.

11. A method of manufacturing a semiconductor device, comprising the steps of:
providing a susceptor disposed in a first section in a hermetic chamber which has a second section connected to said first section;
providing a work gas in the hermetic chamber;
providing conditions of first plasma generated based upon said work gas with first excitation energy and a first RF bias applied to the susceptor carrying a first test workpiece and having a first frequency above 1 MHz, the first plasma satisfying an electrically neutral condition on a top surface of the first test workpiece;
providing a second productive workpiece on the susceptor which workpiece is covered with an insulating mask having an opening, the aspect ratio of which is at least 0.7;
supplying an etchant gas into the hermetic chamber;
applying second excitation energy which is the same as said first excitation energy to the etchant gas in said second section to generate a second plasma, the generated second plasma being allowed to flow into said first section to carry out etching; and
applying a second RF bias having a maximum frequency of 1 MHz to said susceptor preventing charge-up of the wiring layer and hence damage.

12. A method according to claim 11, further comprising the step of applying a divergent main magnetic field in said hermetic chamber.

13. A method according to claim 12, wherein said excitation energy is micro wave and intensity of said divergent main magnetic field and micro wave frequency are so selected to satisfy electron cyclotron resonance.

14. A method according to claim 12, further comprising the step of applying a first auxiliary magnetic field to the second section.

15. A method according to claim 14, wherein said first auxiliary magnetic field has a same direction as that of said divergent main magnetic field.

16. A method according to claim 14, wherein said first auxiliary magnetic field has an opposite direction as that of said divergent main magnetic field.

17. A method according to claim 12, wherein said susceptor is placed in a position where said generated second plasma is directed.

18. A method according to claim 12, wherein said second productive workpiece carries a wiring layer which includes a surface area A which faces to another conductive surface through an insulating film and an exposed surface area B which is ten or more times as broad as said surface area A, $B \geq 10A$.

19. A method according to claim 14, wherein said first auxiliary magnetic field is generated by a coil disposed below said susceptor.

20. A method according to claim 14, wherein said first auxiliary magnetic field is generated by a coil disposed above said susceptor.

21. A method according to claim 14, further comprising the step of applying a second auxiliary magnetic field having an opposite direction to said first auxiliary magnetic field in the second section.

22. A method according to claim 11, wherein said second RF bias has a frequency of 400 kHz.

23. A method according to claim 11, wherein said second plasma carries out reactive ion etching in the second section.

24. A method according to claim 23, wherein said etchant gas is $BCl_3+Cl_2$.

25. A method of claim 1, wherein said first frequency is 13.56 MHz.

26. A method of claim 25, wherein said another RF bias has a frequency of 400 kHz.

27. A method of claim 1, wherein said insulating layer is a resist mark.

28. A method of claim 1, wherein said insulating layer is formed of an interlayer insulating layer of the semiconductor device and a resist mask formed thereon.

29. A method of claim 11, wherein said first frequency is 13.56 MHz.

30. A method of claim 29, wherein said second RF bias has a frequency of 400 kHz.

31. A method of claim 11, wherein said insulating layer is a resist mask.

32. A method of claim 11, wherein said insulating layer is formed of an interlayer insulating layer of the semiconductor device and a resist mask formed thereon.

33. A method of manufacturing a semiconductor device, comprising the steps of:
providing conditions of first plasma generated with a plasma exciting means, said plasma exciting means being either inductive coupling or transformer coupling, and an RF bias being different from said plasma exciting means, applied to a first test wafer to be etched and having a first frequency above 1 MHz, the first plasma satisfying an electrically neutral condition on a top surface of the first test wafer; and
then etching either a wiring layer connected to an insulated gate of an insulated gate type field effect transistor or an insulating layer on the wiring layer formed on a second productive wafer by using an insulating mask having an opening, the aspect ratio of which is at least 0.7, and second plasma having uniform characteristics across said second productive wafer by said conditions, said plasma being generated above said second productive wafer by said plasma exciting means, and another RF bias being different from said plasma exciting means, having a maximum frequency of 1 MHz, and applied to said second productive wafer so as to make the amounts of ions and electrons incident upon the surface of said wiring layer or said insulating layer exposed in said opening generally equal to each other preventing charge-up of the wiring layer and hence damage.

34. A method according to claim 33, wherein said plasma exciting means is a micro wave.

35. A method according to claim 33, wherein said second productive wafer to be processed is placed in a position where said generated plasma is directed.

36. A method according to claim 33, wherein said wiring layer includes a surface area A which faces to another conductive surface through an insulating film and an exposed surface area B at which is at least ten times as broad as said surface area A, $B \geq 10A$.

37. A method according to claim 33, wherein said another RF bias has a frequency of 400 kHz.

38. A method according to claim 33, wherein said plasma carries out reactive ion etching.

39. A method according to claim 38, wherein said second plasma comprises an etchant gas of $BCl_3+Cl_2$.

40. A method of claim 33, wherein said insulating layer is a resist mask.

41. A method of claim 33, wherein said insulating layer is formed of an interlayer insulating layer of the semiconductor device and a resist mask formed thereon.

* * * * *

UNITED STATES PATENT AND TRADEMARK OFFICE
CERTIFICATE OF CORRECTION

PATENT NO.    : 6,376,388 B1
DATED         : April 23, 2002
INVENTOR(S)   : Koichi Hashimoto et al.

It is certified that error appears in the above-identified patent and that said Letters Patent is hereby corrected as shown below:

<u>Title page,</u>
Item [73], Assignee, add the following:
-- Fujitsu VLSI Limited, Kasugai (JP) --.

Signed and Sealed this

Sixteenth Day of September, 2003

JAMES E. ROGAN
*Director of the United States Patent and Trademark Office*